United States Patent
France et al.

(10) Patent No.: US 11,373,253 B1
(45) Date of Patent: *Jun. 28, 2022

(54) SYSTEM AND METHOD FOR CONSERVING WATER AND OPTIMIZING LAND AND WATER USE

(71) Applicant: SWIIM System, LTD., Denver, CO (US)

(72) Inventors: Kevin France, Lakewood, CO (US); Stephen W. Smith, Fort Collins, CO (US); Donald Sanborn, Colorado Springs, CO (US)

(73) Assignee: SWIIM System, LTD., Denver, CO (US)

( * ) Notice: Subject to any disclaimer, the term of this patent is extended or adjusted under 35 U.S.C. 154(b) by 292 days.

This patent is subject to a terminal disclaimer.

(21) Appl. No.: 16/679,546

(22) Filed: Nov. 11, 2019

Related U.S. Application Data

(60) Continuation of application No. 15/219,932, filed on Jul. 26, 2016, now Pat. No. 10,474,975, which is a
(Continued)

(51) Int. Cl.
| | |
|---|---|
| *G06Q 50/02* | (2012.01) |
| *G06Q 50/06* | (2012.01) |
| *G06F 30/20* | (2020.01) |
| *G06Q 50/00* | (2012.01) |
| *G06Q 10/06* | (2012.01) |
| *G01F 23/296* | (2022.01) |

(52) U.S. Cl.
CPC .......... *G06Q 50/02* (2013.01); *G01F 23/296* (2013.01); *G06F 30/20* (2020.01); *G06Q 10/06312* (2013.01); *G06Q 10/06315* (2013.01); *G06Q 50/06* (2013.01); *G06Q 50/00* (2013.01)

(58) Field of Classification Search
CPC .................. G06Q 50/02; G06Q 10/06315
See application file for complete search history.

(56) References Cited

U.S. PATENT DOCUMENTS

| | | |
|---|---|---|
| 4,165,532 A | 8/1979 | Kendall et al. |
| 4,176,395 A | 11/1979 | Evelyn-Veere et al. |
| (Continued) | | |

OTHER PUBLICATIONS

McCulloch et al., "Wireless sensor network deployment for water use efficiency in irrigation." Proceedings of the Workshop on Real-world Wireless Sensor Networks, 2008, pp. 46-50, 3 pages, (abstract only).

(Continued)

*Primary Examiner* — Julie M Shanker
(74) *Attorney, Agent, or Firm* — FisherBroyles, LLP; Craig W. Mueller

(57) ABSTRACT

Software, databases, computer models, and a series of monitoring devices are provided that are used collectively to optimize farming operations for the purpose of efficiently utilizing the water right associated with the land while recognizing the potential to transfer a proportional amount of the water right in a lease or sale arrangement to other water users. The contemplated system encourages water conservation by allowing those owning water rights to determine the feasibility of changed farming practices intended to maximize net returns and profitability of their overall farming operations.

29 Claims, 19 Drawing Sheets

Related U.S. Application Data division of application No. 14/634,014, filed on Feb. 27, 2015, now Pat. No. 9,569,803, which is a continuation of application No. 13/831,772, filed on Mar. 15, 2013, now Pat. No. 9,202,252, which is a continuation-in-part of application No. 13/680,835, filed on Nov. 19, 2012, now abandoned, which is a continuation-in-part of application No. 13/076,979, filed on Mar. 31, 2011, now abandoned.

(60) Provisional application No. 61/319,374, filed on Mar. 31, 2010.

(56) References Cited

U.S. PATENT DOCUMENTS

| | | | |
|---|---|---|---|
| 4,244,022 | A | 1/1981 | Kendall |
| 4,396,149 | A | 8/1983 | Hirsch |
| 4,545,396 | A | 10/1985 | Miller et al. |
| 4,646,224 | A | 2/1987 | Ransburg et al. |
| 4,740,882 | A | 4/1988 | Miller |
| 4,755,942 | A | 7/1988 | Gardner et al. |
| 4,760,547 | A | 7/1988 | Duxbury |
| 4,799,142 | A | 1/1989 | Waltzer et al. |
| 4,892,113 | A | 1/1990 | Fattahi |
| 4,962,522 | A | 10/1990 | Marian |
| 4,992,942 | A | 2/1991 | Bauerle et al. |
| 5,023,787 | A | 6/1991 | Evelyn-Veere |
| 5,097,861 | A | 3/1992 | Hopkins et al. |
| 5,229,937 | A | 7/1993 | Evelyn-Veere |
| 5,467,271 | A * | 11/1995 | Abel .................. A01B 79/005 702/5 |
| 5,696,671 | A | 12/1997 | Oliver |
| 5,839,660 | A | 11/1998 | Morgenstern et al. |
| 6,058,379 | A | 5/2000 | Odom et al. |
| 6,145,755 | A | 11/2000 | Feltz |
| 6,179,216 | B1 | 1/2001 | Panhelleux |
| 6,298,285 | B1 | 10/2001 | Addink et al. |
| 6,314,340 | B1 | 11/2001 | Mecham et al. |
| 6,397,162 | B1 | 5/2002 | Ton |
| 6,453,215 | B1 | 9/2002 | Lavoie |
| 6,453,216 | B1 | 9/2002 | McCabe et al. |
| 6,581,009 | B1 | 6/2003 | Smith |
| 6,600,971 | B1 | 7/2003 | Smith et al. |
| 6,633,786 | B1 | 10/2003 | Majors et al. |
| 6,685,104 | B1 | 2/2004 | Float et al. |
| 6,694,195 | B1 | 2/2004 | Garcia |
| 6,782,311 | B2 | 8/2004 | Barlow et al. |
| 6,805,147 | B2 | 10/2004 | Yoshioka et al. |
| 6,823,239 | B2 | 11/2004 | Sieminski |
| 6,892,113 | B1 | 5/2005 | Addink et al. |
| 6,892,114 | B1 | 5/2005 | Addink et al. |
| 6,895,987 | B2 | 5/2005 | Addink et al. |
| 6,898,467 | B1 | 5/2005 | Smith et al. |
| 6,944,523 | B2 | 9/2005 | Addink et al. |
| 6,947,842 | B2 | 9/2005 | Smith et al. |
| 6,950,728 | B1 | 9/2005 | Addink et al. |
| 6,963,808 | B1 | 11/2005 | Addink et al. |
| 6,990,459 | B2 * | 1/2006 | Schneider .......... G06Q 10/0635 705/7.36 |
| 7,031,927 | B1 | 4/2006 | Beck et al. |
| 7,048,204 | B1 | 5/2006 | Addink et al. |
| 7,050,887 | B2 | 5/2006 | Alvarez |
| 7,058,478 | B2 | 6/2006 | Alexanian |
| 7,084,775 | B1 | 8/2006 | Smith |
| 7,096,094 | B2 | 8/2006 | Addink et al. |
| 7,103,479 | B2 | 9/2006 | Patwardhan et al. |
| 7,146,254 | B1 | 12/2006 | Howard |
| 7,155,377 | B2 | 12/2006 | Porter et al. |
| 7,165,730 | B2 | 1/2007 | Clark et al. |
| 7,182,272 | B1 | 2/2007 | Marian |
| 7,184,965 | B2 | 2/2007 | Fox et al. |
| 7,216,020 | B2 | 5/2007 | Marian |
| 7,216,659 | B2 | 5/2007 | Caamano et al. |
| 7,229,026 | B2 | 6/2007 | Evelyn-Veere |
| 7,266,428 | B2 | 9/2007 | Alexanian |
| 7,280,892 | B2 | 10/2007 | Bavel |
| 7,286,904 | B2 | 10/2007 | Graham |
| 7,305,280 | B2 | 12/2007 | Marian |
| 7,317,972 | B2 | 1/2008 | Addink et al. |
| 7,337,042 | B2 | 2/2008 | Marian |
| 7,353,113 | B2 | 4/2008 | Sprague et al. |
| 7,359,769 | B2 | 4/2008 | Bailey et al. |
| 7,400,944 | B2 | 7/2008 | Bailey et al. |
| 7,401,036 | B2 | 7/2008 | Vande Pol |
| 7,403,840 | B2 | 7/2008 | Moore et al. |
| 7,412,303 | B1 | 8/2008 | Porter et al. |
| 7,430,458 | B2 | 9/2008 | Dansereau et al. |
| 7,805,380 | B1 * | 9/2010 | Hornbeck ............ G06Q 50/165 705/315 |
| 9,202,252 | B1 | 12/2015 | Smith et al. |
| 2002/0066484 | A1 * | 6/2002 | Stringam ............... A01G 25/16 137/392 |
| 2002/0103688 | A1 * | 8/2002 | Schneider .......... G06Q 10/0637 705/26.1 |
| 2004/0181315 | A1 | 9/2004 | Cardinal et al. |
| 2005/0234691 | A1 | 10/2005 | Singh et al. |
| 2005/0246102 | A1 | 11/2005 | Patwardhan et al. |
| 2006/0250578 | A1 | 11/2006 | Pohl et al. |
| 2008/0120255 | A1 | 5/2008 | Adams |
| 2008/0183523 | A1 | 7/2008 | Dikeman |
| 2009/0005990 | A1 * | 1/2009 | Anderson ............. G06Q 10/00 702/2 |
| 2010/0306012 | A1 | 12/2010 | Zyskowski et al. |

OTHER PUBLICATIONS

"Welcome to Water2Save—A Water Management Service with Look-Ahead ET," at http://www.water2save.com/, copyright 2007-2010, 2 pages.

Smith, "Strategies for Limited and Deficit Irrigation to Maximize On-Farm Profit Potential in Colorado's South Platte Basin," Doctor of Philosophy Dissertation, Colorado State University, 2011, 183 pages.

Official Action for U.S. Appl. No. 13/076,979 dated Feb. 10, 2012, 5 pages.

Official Action for U.S. Appl. No. 13/076,979 dated May 18, 2012, 17 pages.

Official Action for U.S. Appl. No. 13/076,979 dated Mar. 12, 2013, 18 pages.

Official Action for U.S. Appl. No. 13/831,772 dated Aug. 23, 2013, 49 pages.

Official Action for U.S. Appl. No. 13/831,772 dated Aug. 11, 2014, 4 pages.

Final Action for U.S. Appl. No. 13/831,772 dated Feb. 27, 2014, 41 pages.

Notice of Allowance for U.S. Appl. No. 13/831,772 dated Feb. 25, 2015, 15 pages.

Official Action for U.S. Appl. No. 14/634,014 dated May 25, 2016, 6 pages, Restriction Requirement.

Official Action for U.S. Appl. No. 14/634,014 dated Aug. 5, 2016, 8 pages.

Official Action for parent U.S. Appl. No. 15/219,932, dated Jul. 18, 2019.

* cited by examiner

Linear Optimization Model Elements Defined

| | Element Definition | Equation Examples Specific to this Model | Notes or Clarification |
|---|---|---|---|
| Objective Function | The quantity that is to be minimized or maximized using optimization techniques and algorithms. | Objective function = maximized net return, NR<br><br>Net return, NR = revenue – fixed operating costs | Maximized net return is the NR based on the imposed constraints, decision variables, model parameters, and user inputs. |
| Constraints | Constraints are quantities that constitute physical limits and define the boundaries within which the model attempts to find an optimal solution. | Field 1 Acreage = $F_1$<br>Field 2 Acreage = $F_2$<br>Total farm acreage = $\sum (F_1 ... F_x)$<br><br>A user may enter a min and max number of acres for each crop and each fallowed field.<br><br>NR $\geq$ 0 unless it is fallowed.<br><br>Available water CU volume < $\_W$<br><br>For a deficit irrigated crop, the user defines a min and max percent of full irrigation that can be applied.<br><br>Crops: Fully irrigated corn = "yes" deficit irrigated wheat = "no"<br><br>Full irrigation yield = $Y_2$<br>Dryland yield = $Y_1$ | Taken collectively, constraints limit the possible crop / field and water combinations and define limits for the whole of the farming operation for the year modeled. Each individually named field has constraints and the farm as a whole has constraints. |
| Decision Variables | Quantities that can be varied within the model to optimize the objective function or in making comparisons between differing model runs. Also, variables that the Model sets to maximize net return during an optimization run. | The crop and amount of water for each field | Examples of decision variables are crop selection and cropped acreage needed to achieve $R within the defined constraints. The decision variables represent the crop selected for each field and the amount of water applied to each field. |
| Model Parameters | Fixed input assumptions that do not change during a model run. Biological and economic assumptions that influence the optimal solution but are set for a single Model run based on user inputs or assumed values. | Crop water production functions and variable crop production costs.<br><br>Soil type for each field.<br>Irrigation method for each field. | See Appendix A for default values – operating costs and associated units by crop and full irrigation yield averages. |

Note:
1) Crop water production functions are a linear relationship between ET and yield that is adjusted to the efficiency of the irrigation method. The result is a non-linear, hyperbolic relationship between water and crop yield.
2) Parameters of the water production function are the amount of water for a fully irrigated yield depending on crop and soil type.
3) Crop yields with full irrigation or no irrigation are dependent on crop and soil type.

| Crop | Irrigation Depth (inches) | Nitrogen Rate (lbs/acre) | Area in Production (acres) | Water Used (acre-ft) | Yield (unit/acre) | Net Return ($/acre) | Total Net Return ($) |
|---|---|---|---|---|---|---|---|
| Alfalfa | 0.0 | - | 0.0 | 0.0 | 5.4 | $ - | $ - |
| Corn | 10.5 | 221.0 | 128.0 | 112.0 | 202.2 | $ 203 | $ 26,006 |
| Edible Beans | 0.0 | - | 0.0 | 0.0 | 10.0 | $ - | $ - |
| G. Sorghum | 0.0 | 86.5 | 0.0 | 0.0 | 56.0 | $ - | $ - |
| Soybeans | 0.0 | - | 0.0 | 0.0 | 64.4 | $ - | $ - |
| Sugar Beets | 0.0 | 41.4 | 0.0 | 0.0 | 7.0 | $ - | $ - |
| Sunflower | 17.7 | 173.0 | 2.0 | 2.9 | 150.0 | $ 151 | $ 302 |
| Wheat | 10.0 | 95.8 | 0.0 | 0.0 | 66.1 | $ 67 | $ 0 |
| Total | | | 130.0 | 114.9 | | | $ 26,308 |

| | Water Leased (acre-ft) | Net Return ($/acre-ft) | Total Net Return ($) |
|---|---|---|---|
| Leased Water Revenue | 90.4 | $ 454 | $ 41,042 |

| | Overall Net Return | $ 67,350 |
|---|---|---|

FIG. 13

SYSTEM AND METHOD FOR CONSERVING WATER AND OPTIMIZING LAND AND WATER USE

This application is a continuation of U.S. patent application Ser. No. 15/219,932, filed Jul. 26, 2016, now U.S. Pat. No. 10,474,975, issued Nov. 12, 2019, which is a divisional of U.S. patent application Ser. No. 14/634,014, filed Feb. 27, 2015, now U.S. Pat. No. 9,569,803, issued Feb. 14, 2017, which is a continuation of U.S. patent application Ser. No. 13/831,772, filed Mar. 15, 2013, now U.S. Pat. No. 9,202,252, issued Dec. 1, 2015, which is a continuation-in-part of abandoned U.S. patent application Ser. No. 13/680,835, filed Nov. 19, 2012, which is a continuation-in-part of abandoned U.S. patent application Ser. No. 13/076,979, filed Mar. 31, 2011, which claims the benefit of U.S. Patent Application Ser. No. 61/319,374, filed Mar. 31, 2010, the entire disclosures of which are incorporated by reference herein.

Portions of this application are related to the dissertation of Stephen W. Smith, PhD., entitled "Strategies for Limited and Deficit Irrigation to Maximize On-Farm Profit Potential in Colorado's South Platte Basin," submitted to the Department of Civil and Environmental Engineering of Colorado State University, Fort Collins, Colo., spring 2011, which is incorporated by reference in its entirety herein.

FIELD OF THE INVENTION

Embodiments of the present invention are generally related to a system, method, and process for monitoring, collecting, and analyzing data related to climate conditions, soil moisture, evapotranspiration, return water flow, groundwater, water consumption, water balance, and other data related to water use to help assess an overall water budget of a particular parcel or parcels of land. Further, some embodiments of the present invention compare current water consumption with historical water consumption to allow a water right holder associated with the parcel(s) of land to manage and optimize their agricultural operations and to trade, lease, or otherwise convey, all or a proportion of the water right to other uses, both agriculture and non-agriculture (i.e., municipal, industrial and/or environmental).

BACKGROUND OF THE INVENTION

Water rights are property rights associated with, but not integrally tied to, a parcel of land and vary depending on the location and jurisdiction where the right is located. For example, much of the eastern United States follows a Riparian water rights model wherein land owners with property located adjacent to a body of water have the right to make reasonable use thereof. During a water shortage, a land owner's water allotment is a function of the property's frontage to the water source. Riparian water rights are therefore conveyed with the land.

In contrast, the scarcity of water in the western United States, such as Colorado and other western states, spurred the development of a "prior appropriation" water right model. In a prior appropriation water right model the land owner enjoys a right to apply water to a "beneficial use" subject to a decree. Under a prior appropriation water model, the first person to take a quantity of water from a water source for a "beneficial use," such as agricultural irrigation, has the right to continue to consume that quantity of water for that defined purpose indefinitely. Junior users can use the remainder of water available from a particular water source so long as they do not infringe on a senior user's rights. Each individual's water right is associated with a historical yearly quantity of water that was beneficially used and an appropriation date that defines the seniority of their right. In some jurisdictions, if one does not apply his or her water allotment to a beneficial use over a predetermined period of time, the water right may lapse and a junior water rights holder may petition an appropriate governing body for ownership of the non-used portion of the senior user's water right. Thus, water rights owners may lose valuable water rights if they implement strategies to conserve their consumptive water usage.

However, water rights under the prior appropriation model are not always connected to the land and can in some circumstances be transferred similar to real property. Indeed, some prior appropriation jurisdictions allow water right holders to sell, or otherwise convey all or a portion of their consumptive use water right to a third party. In these situations, the proceeds of the water right sale can be used to offset the costs of conservation efforts, which may include loss of crop revenue, decreased crop yield, legal and engineering transaction fees, monitoring instrumentation, flow measurement, and jurisdictional reporting. More specifically, the water right holder is able to trade his/her previously-defined water right in a "water market" or "water bank" to a willing buyer. In practice, a water court, or other administrative body, assesses historical water usage data associated with a parcel of land, defines and quantifies the total water appropriation amount for that parcel of land, and approves the amount of water that may be sold to a third party.

As one might imagine, many water right holders are interested in conserving their water and monetizing some portion of their water right (see FIG. 1) for economic benefit. However, there is no systematic method or system that identifies individual elements of a water right so that the total amount of water that may be conserved can be estimated. Also, no tool exists that allows the water right holder to estimate the economic impact of a proposed water conservation effort and allows them to streamline the bureaucratic process associated with reporting water use to facilitate a sale or lease of water.

Thus there is a long-held need to provide a system that optimizes agricultural land and water use and facilitates water conservation by allowing a holder of a water right to assess actual water usage and compare such quantity with the historical water usage allotment, wherein the difference between the actual use (actual consumptive use plus historical return flow obligations) and the historical use (historical consumptive use and historical return flow obligations) would be available for trade, sale, or lease. One embodiment of a system contemplated by the present invention is sometimes referred to herein as SWIM® or Sustainable Water and Innovative Irrigation Management®.

SUMMARY OF THE INVENTION

Water Conservation

It is one aspect of embodiments of the present invention to provide a system for planning optimal limited water use with an associated water monitoring, data logging, recording, storage, and transmission system for use with one or more parcels of land or within a geographically-defined area. One embodiment of the present invention employs one or more server-side and client-side applications that are linked by personal data assistants ("PDAs"), cellular telephones, smart phones, portable computers, or similar devices. The contemplated system may include several integrated modules that allow a water user, such as a farmer or ditch company, to model different water use scenarios associated with crop selection, crop planting locations, crop rotation, and irrigation plans. For example, one system allows a farmer to explore different irrigation techniques with the goal of limiting consumptive use water so that an allotment of water for lease or sale to other water users can be identified. One embodiment employs an intuitive user-friendly graphical interface with modeling and real time (or near real time) data verification to the various applications. Additional data could be systematically provided to the system through pre-existing remote sensing, mobile, and geographic information systems (GIS). Data sources may be public or private.

In operation, a water requirement associated with a particular parcel(s) of land is determined using individual user and/or system inputs. Such inputs may include crop type, crop location, geographic location, historic cropping and water use, historic rain or snowfall data, geographic character of the land, field size, field location, planting schedule, rotation schedule, harvest schedule, etc. Next, water that could be conserved is identified by analyzing farmer wishes, environmental conditions, commodity prices, and other relevant data. Farmer's wishes may include acceptable irrigation methods, acceptable crop varieties, acceptable field size, acceptable income, etc.

At least some environmental condition data may be gathered by one or more field monitoring systems to help farmers adhere to planned limited irrigation schemes and provide underpinning of reports to regulatory agencies. Monitoring may employ various sensors, data collection and storage devices, and communication devices, which may communicate either by wire or wirelessly to a software tool, i.e. a water use and land use "manager" that may be installed on a central server or similar computing device. Monitoring may be used to identify environmental conditions on a continuous real-time basis or pursuant to a predetermined schedule. Monitoring may also provide pre-event or post-event alarms, which may notify the user of weather events that may affect the irrigation scheduling plan so that adjustments to the system, irrigation schedules, etc. can be made. In this example, the predefined irrigation operations plan that adheres to a water budget is suggested by a "planner" and accepted by a farmer during a growing season. Thus, an alarm could be triggered if a storm deposits rainfall onto the parcel, which would allow the farmer to alter a pending irrigation event. This functionality will also allow the farmer to adjust an irrigation plan to maximize crop production.

One goal of embodiments of the present invention is thus to provide tools for planning and optimization of water usage and to create a water asset balance, which allows a water right owner to maximize the return on the investment and their annual net returns. One intent is to maximize a land owner's profit tied to their water right and their farming operations as opposed to only maximizing crop yield (i.e., farming operation profit) with little quantification or concern as to the actual amount of water applied.

Planner

As mentioned above, it is one aspect of the present invention to provide a land and water use planning system and method. In one embodiment of the system, the farmer inputs various information related to current water use and crop configuration into the planning system. This data may include existing and acceptable crop mix i.e., (wheat, sugar beets, corn, sunflower and/or dried beans, etc.), acreage, irrigation method, soil types, water supply, climatic data, rainfall predictions, historical data, return flow from runoff and to groundwater, crop yields, commodity prices, water shares currently controlled, assessment costs and amount of water rights currently leased or owned. Information about the economics associated with the farm may also be input and used to project land use changes, alternative practices, and potential profit.

The planner will output various information that will help the farmer optimize land and water use associated with the parcel under consideration. The planner of one embodiment of the present invention may output information related to estimated dollars per acre per crop, suggested cropping patterns and rotation, crop coefficients, historical water use, predicted water use, change in net revenues, etc. Cropping plans from individual farms may be aggregated for monitoring, management, and reporting by a land and water management tool, i.e., "manager." Further, a water-related portfolio, i.e., an irrigation schedule to be utilized by a water management consortium, a ditch company, or other water manager may be generated. Reports required by water agencies may also be generated. Crop water production functions and crop coefficients for use in the evapotranspiration rate equations may also be used in the projections, including those projections related to regulated deficit irrigation and related farming practices.

It is yet another aspect of the present invention to provide a planning/monitoring system that is easy to use. As one skilled in the art will appreciate, one embodiment of the contemplated planner is to be used primarily by farmers who may have limited time to devote to land/water planning. Thus, one embodiment of the invention employs common third-party applications and an easy to use input system to encourage use of the planning system.

The "planner" or "planning system," as used with respect to some embodiments of the invention, refers to a computer program or a module thereof that is accessible by way of a personal computer, smart phone, or other computing methods known in the art. The planner of one embodiment gathers data from various sources, some of which comprise data entered by the land owner and outputs a suggested land/water use plan to the land owner. The land/water use plan may be selectively altered (with a smart phone, a call to a third party who monitors the plan, a laptop, a computer work station, etc.) so that the land owner can change the land use plan or irrigation schedule as needed. To maximize profits from crops and/or water right sales, the planner may be associated with an optimizer.

Optimizer

It is another aspect of the present invention to provide a system that uses a collection of algorithms, processes, technology, field methods, data, and methodologies that facilitate planning and integration of other related resources to evaluate and to optimize existing farming practices. The goal of one embodiment of the present invention is to improve farming operations while benefiting from a proportional parting off of pre-established and pre-quantified water rights. Thus, as water is budgeted and reapportioned, an individual's share of water may be sold or leased to other users for suitable compensation. The optimizer allows a user to consider multiple "willing to grow" strategies and based upon this input, provide suggestions as to the best use of assets, including the land and water.

Monitors

As discussed above, embodiments of the present invention include an intelligent monitoring scheme (sometimes referred to herein as a "manager" or "management tool") which can be associated with one or more parcels of land as an integrated management system. One contemplated monitoring system may include a plurality of sensors including, but not limited to: 1) soil moisture measuring devices such as: tensiometers, neutron probes, gypsum blocks, capacitance sensors, or other soil moisture and potential measurement technologies and devices; 2) evapotranspiration measuring devices and techniques such as lysimeters, remote thermal unit recorders and data loggers, and thermal (heat signature) and near infrared imagery; 3) soil chemistry recorders; and 4) water quality monitoring devices that measure water temperature, pH, conductivity, and ion concentrators. Further embodiments of the monitoring system may gather information from tracer tests, aquifer tests, and satellite and low altitude aerial data gathering techniques. Water flow measurement devices such as flumes, weirs, propeller meters, pressure transducers, shaft encoders, flow velocity sensors, ultrasonic level sensors, etc., may also be incorporated into the monitoring system. Further, some or all of the contemplated data may be gathered by on-site mobile data acquisition devices.

As weather is critical in assessing the amount of water being used, weather monitoring equipment (i.e., data loggers), such as temperature and relative humidity probes, precipitation gauges, anemometers and pyranometers may also be employed as part of the overall scheme. One skilled in the art will appreciate that Bowen ratio equipment, eddy covariance equipment, scintillometer (used to measure small fluctuations of the refractive index of air), near infrared and heat signature cameras, and stationary or vehicle-mounted evapotranspiration sensors may also be used to gather data. For example, data related to wind speed (using an anemometer), solar radiation (using a pyranometer), temperature, rainfall, soil moisture (using a tensiometer/neutron probe or soil moisture probe), may be gathered. The purpose of soil moisture sensors could be twofold: 1) soil moisture monitoring to predict when the next irrigation should occur (i.e., soil moisture based irrigation scheduling); and 2) monitoring to understand at least the fact of, or the lack of, subsurface soil moisture movement below the root zone which would indicate subsurface return flows. Some or all gathered data may be analyzed to monitor and assess various desired metrics and generate reports. Evapotranspiration rate equations used in the system include, but are not limited to, the Penman-Monteith equation, the Blaney-Criddle equation, the standardized ASCE equation, and other relevant equations.

In addition, some embodiments of the present invention employ hand-held mobile communication devices, and stationary and vehicle-mounted sensors to monitor on-site crop stress and evapotranspiration. Ground level measurements may be used to calibrate or interpret remotely sensed imagery (i.e., thermal, near infrared, etc.). Aircraft mounted and satellite sensors, used in conjunction with GIS data and remote sensing, which can normalize differences in a vegetative index and other techniques, may be used to develop an assessment of land and water use and potential for changed practices. Remote sensing may more particularly also include near infrared and heat signature data collection by satellites, airplanes, helicopters, autonomous vehicles, unmanned aerial vehicles (UAFs), unmanned balloons, manned balloons, etc.

As alluded to above, a series of vehicles, such as trucks, vans, and/or all-terrain vehicles may be outfitted with sensors and RGB and near-infrared cameras. These vehicles could provide access to different crop locations, obtain photographs or digital images of crops, and perform onsite analysis or post processing analysis. For example, comparing evapotranspiration and crop stress measurements is a functional embodiment. Further, by utilizing the latest smart phones, which have advanced web-based or cellular communication functionality and built-in high quality cameras, it is contemplated that a water right owner or other party could take a "snap-shot" picture of their crops and feed the data electronically to the monitoring system by way of a software application integrated into the communication device. It is also envisioned that a farmer or other individual associated with the monitoring systems could use one or more wireless monitors that communicate with a central server or similar device wherein data would be analyzed, reduced, reported, etc.

The list of equipment and techniques discussed above is not inclusive as will be appreciated by one skilled in the art. In addition, as research and development continues, monitoring instrumentation, communication devices, computing devices, and the technology related thereto may change and improve and such improvements are deemed to be included within terms such as "sensor", "monitor", "instrument", or other similar terms used herein.

It is another related aspect of embodiments of the present invention to facilitate energy conservation. Again, some embodiments of the present invention facilitate water conservation by allowing individuals to closely monitor and alter the amount of water being used for irrigation or other beneficial purposes. Accordingly, electrical energy associated with water pumps and irrigation system control will necessarily be reduced. In addition, costs associated with growing crops, including fertilizer, seed, and plant harvesting expense (labor), will be saved. That is, it is contemplated that at least a portion of the previously-grown crops will not be grown, because the income from leasing or selling a portion of the previously-needed water right will be greater than the profit tied to that crop.

In the agricultural context, the monitoring and planning systems and related functionality contemplated herein allows a farmer, engineer, land planner, or others to efficiently and intelligently implement field fallowing, rotational field fallowing, dry farming, or regulated deficit irrigation practices on a selectively adjustable schedule to conserve water. For example, depending on the weather affecting a parcel of land, change in economic objectives, or other factors, a farmer may wish to change their planting or irrigation operational plan. Thus, one embodiment of the present invention allows a farmer or others to identify and optimize actual water use on a per crop basis by measuring evapotranspiration rates of water, affirming regulated deficit irrigation programs, and actual consumptive water use on a real-time or near real-time basis.

It is another aspect of the present invention to provide a system that produces reports and comparative data. Often municipalities, ditch companies, water districts, state agencies, etc. require periodic reports of water use to compliment and expand their historical data. Embodiments of the present invention generate required reports for submission to appropriate organizations, perhaps automatically or at predetermined intervals. In this way, the farmer or water right buyer or lessee does not have to be concerned with generating and forwarding such information on a periodic basis. Reports will often aid farmers and water users to ensure successful use and implementation of the technology described herein. Further, such reports may be used as a record of, for example, a farm's efficiency to help that farmer further optimize crop location and rotations or other practices.

As will be appreciated, it is a further aspect of the present invention that reports generated by the overall system can be utilized in water court and other appropriate judicial or pseudo-judicial bodies to establish pre-existing water rights so that water, which has been conserved through implementation of various conservation technologies and/or techniques, etc., can be sold or leased. Accordingly, it is contemplated that the reports generated by the system can be the backbone of a request by a water right holder to an appropriate organization to receive the legal right to sell or lease a certain amount of their water rights. Once that judicial declaration has been received, the water right owner can then proceed to the open market to sell or lease their right proportionally, thus capturing the value of their right and perhaps offsetting the cost of changed practices.

The Summary of the Invention is neither intended nor should it be construed as being representative of the full extent and scope of the present invention. Moreover, references made herein to "the present invention" or aspects thereof should be understood to mean certain embodiments of the present invention and should not necessarily be construed as limiting all embodiments to a particular description. The present invention is set forth in various levels of detail in the Summary of the Invention as well as in the attached drawings and the Detailed Description of the Invention and no limitation as to the scope of the present invention is intended by either the inclusion or non-inclusion of elements, components, etc. in this Summary of the Invention. Additional aspects of the present invention will become more readily apparent from the Detail Description, particularly when taken together with the drawings.

BRIEF DESCRIPTION OF THE DRAWINGS

The accompanying drawings which are incorporated in and constitute a part of the specification, illustrate embodiments of the invention and together with the general description of the invention given above and the detailed description of the drawings given below, serve to explain the principles of these inventions.

FIG. 8 is a table showing the primary elements of the optimization model of one embodiment of the invention;

FIG. 10 shows a graphical user interface associated with a crop selection portion of the planner of one embodiment of the invention;

FIG. 11 is a graphical user interface showing an optimized land and water use plan generated by the planner of one embodiment of the present invention;

FIG. 13 shows a sample management report generated by the planner of one embodiment of the invention;

Figure 1:
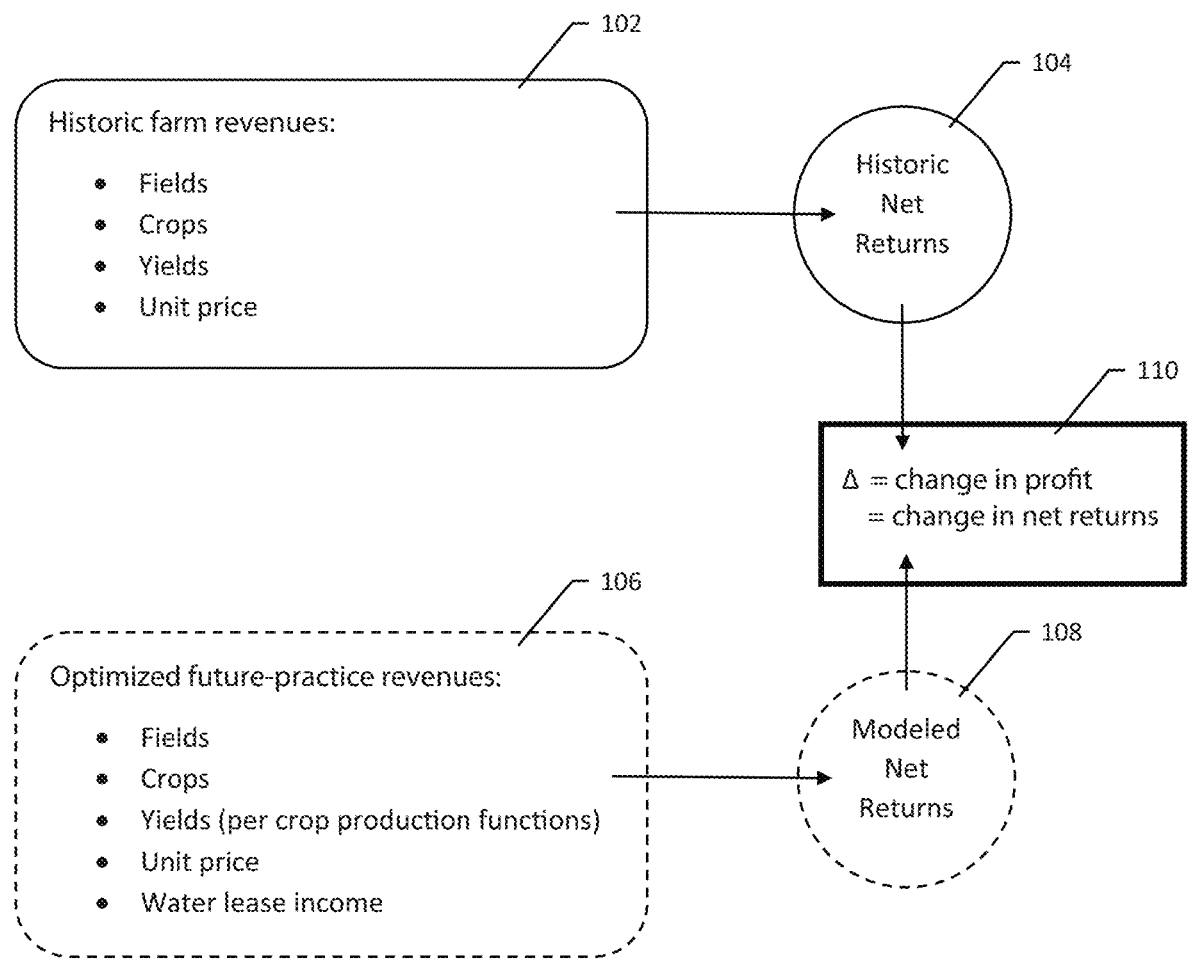
FIG. 1 is an illustration showing the change in net revenues and profit that may be realized by users of embodiments of the present invention.

To assist in the understanding of one embodiment of the present invention the following list of components and associated numbering found in the drawings is provided herein:

\# Component
100 Change in net returns
102 Historic revenues
104 Historic net returns
106 Future revenues
108 Modeled net returns
110 Change in net returns
202 River
204 Diversion
206 Canal
208 Tail end returns
210 On-farm conveyance
212 Irrigation
214 Consumptive use (CU)
216 Saved CU
218 Surface return flow (Run-off)
220 Subsurface return flow (deep percolation)
222 Conveyance losses and subsurface return flows returned to river
300 Irrigation management implementation scheme
300P Planning/modeling phase
300D Design implementation phase
300F Farming/maintenance phase
302 General data
304 Historic data
306 Model constraints
308 Optimization tool
310 Optimization Results
312 Aggregated results
314 Are farm or ditch changes needed?
330 Farm redesign
332 Irrigation system construction
334 Diversion structure construction
336 Measurement/check structures construction
338 Installation of monitoring and communication equipment
340 Configuration of data collection software
342 Installation of control equipment
360 Implement cropping plan
362 Data collection
364 Irrigation scheduler
400 Monitoring System
402 Monitor
404 Field
406 Crops
408 Work station
410 Aerial data collection
412 Weather station
414 Satellite data collection
416 Full irrigation
418 Regulated deficit irrigation
420 Fallowed field 500 SWIM system architecture
502 Client
504 Internet
506 Firewall
508 SQL server
510 GIS Server
512 SCADA Instrumentation
514 Application Server
600 Farmer activities
602 Client application
604 Water cooperative activities
606 Local storage
608 Global server
700 Data entry
702 Optimization
704 Store results
706 Upload preferred crop plan to coop
1400 System for monitoring water flow
1402 Stilling well
1404 Solar panel
1406 Channel
1408 Remote transmission unit
1410 Radio
1500 Mobile data gathering system
1502 Vehicle
1504 Data collection array
1508 Near infrared (NIR) camera
1510 Thermal camera
1512 RGB Camera
1514 Antenna
1600 System
1605 Computers
1610 Computers
1615 Computers
1620 Network
1625 Server computer
1630 Application server
1635 Data base
1700 Computer system
1705 CPU
1710 Input device
1715 Output device
1720 Storage device
1725 Media reader
1730 Communications system
1735 Processing acceleration unit
1740 Memory
1745 Operating system
1750 Code
1755 Bus It should be understood that the drawings are not to scale. In certain instances, details that are not necessary for an understanding of the invention or that render other details difficult to perceive may have been omitted. It should be understood, of course, that the invention is not necessarily limited to the particular embodiments illustrated herein.

DETAILED DESCRIPTION

Figure 2:
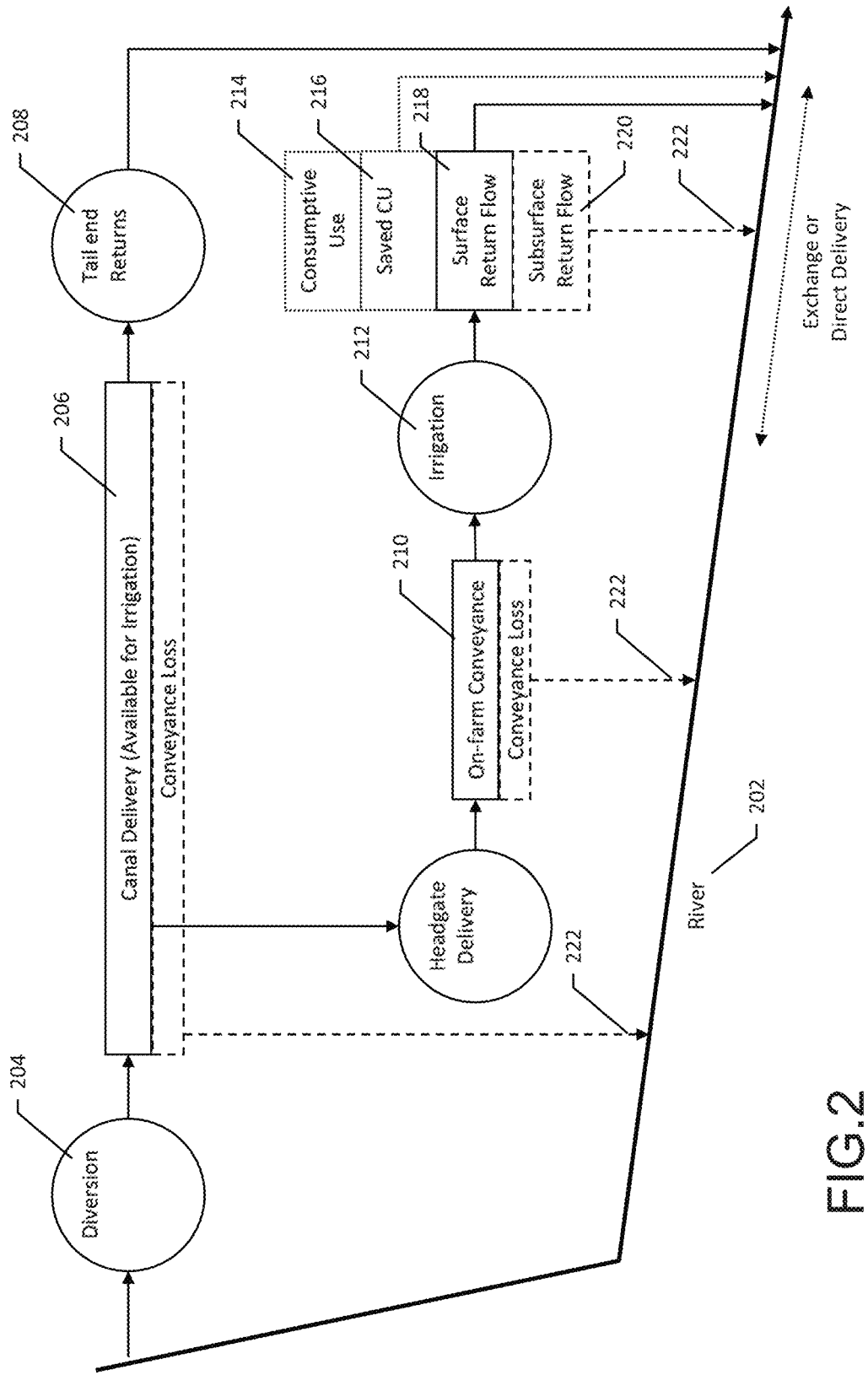
FIG. 2 is a water balance diagram associated with a river and ditch or canal system.

A water balance of the river, canal, or the farm is a useful means of understanding the sources of and the destinations of water. FIG. 2 provides a conceptual rendering of a water balance analysis, from the river diversion downstream to the on-farm distribution system. Basically, what this illustrative graphic shows is what happens to water once it is diverted from the river 202 into a ditch or canal 206 for irrigation purposes. In many ditch company operations, the character of the water changes significantly as one moves downstream in the canal. Colloquially, some would say that the "color" of the water changes; a reference to where the water came from, or where it is bound, or its decreed use.

After diversion into an earthen canal, the diverted flow immediately begins to diminish because of conveyance losses, the most notable of which is seepage. Other losses are attributable to phreatophytes and evaporation from the water surface. Seepage can be quite significant especially over the full length of the canal and is likely the single highest source of loss in earthen canals. Most seepage returns to the river as subsurface flows 222 and the time it takes to actually arrive at the river is a function of distance from the river and the characteristics of the alluvium. This seepage can vary considerably over the length of a canal as well. With a water right change case, this historic surface and subsurface return flow pattern must be maintained into the future.

Moving downstream through the canal, some water returns to the river via the end of the canal as wastage or operational spill 208. Some canals have historically diverted a generous amount of water to assist with practical canal operations. It is easier to deliver equitable flows to canal headgates, especially those at the end of the canal, if the canal is flowing nicely with excess water that can be returned to the river for other downstream users.

Continuing reference to FIG. 2, a headgate delivery to the farm has similar water balance characteristics as with the main canal. However, the headgate delivery frequently represents the point at which the company's delivery responsibility ends and the individual farmer's responsibility begins. Downstream of the farm headgate, there are often on-farm conveyances 210 (ponds and delivery ditches) from which there are losses, and again, those loses are most notably seepage that constitutes historic return flows that must be maintained.

Once water is delivered to on-farm irrigated fields, and on through the associated farm irrigation systems, the key elements of irrigation water can be identified as consumptive use 214 ("CU"), surface return flows 218, and subsurface return flows 220. Within the consumptive use amount, there is a proportion that may be appropriately termed "conserved" or "saved" or "set-aside" CU 216. This amount is the water that might be considered for its higher economic value. The total amount of quantified CU can be evaluated in terms of a water budget. The CU volume can be considered, along with old or new proportional uses, and within the confines of the water budget.

Figure 3:
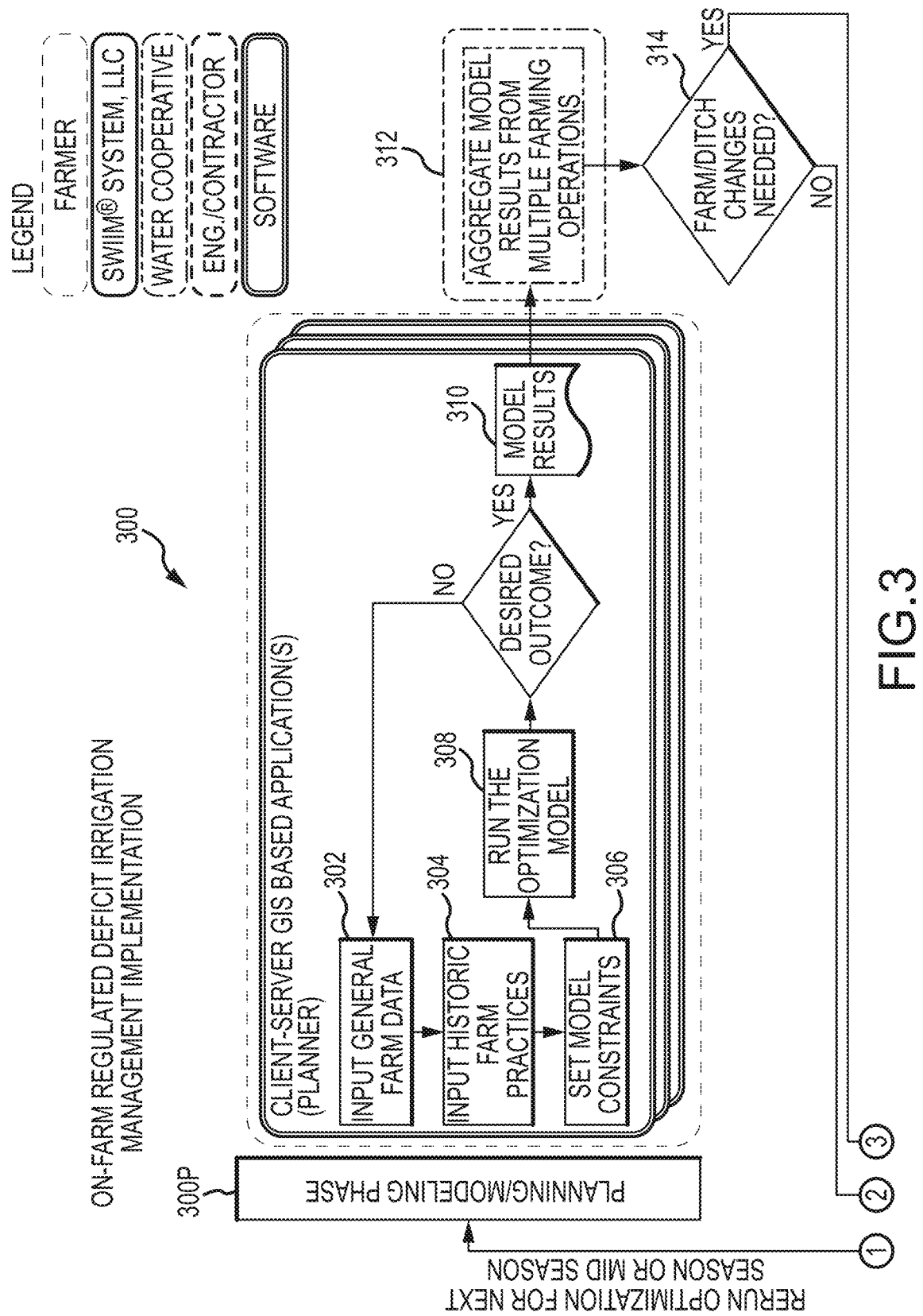
FIG. 3 is a flow chart showing implementation of one embodiment of the present invention.
Figure 3:
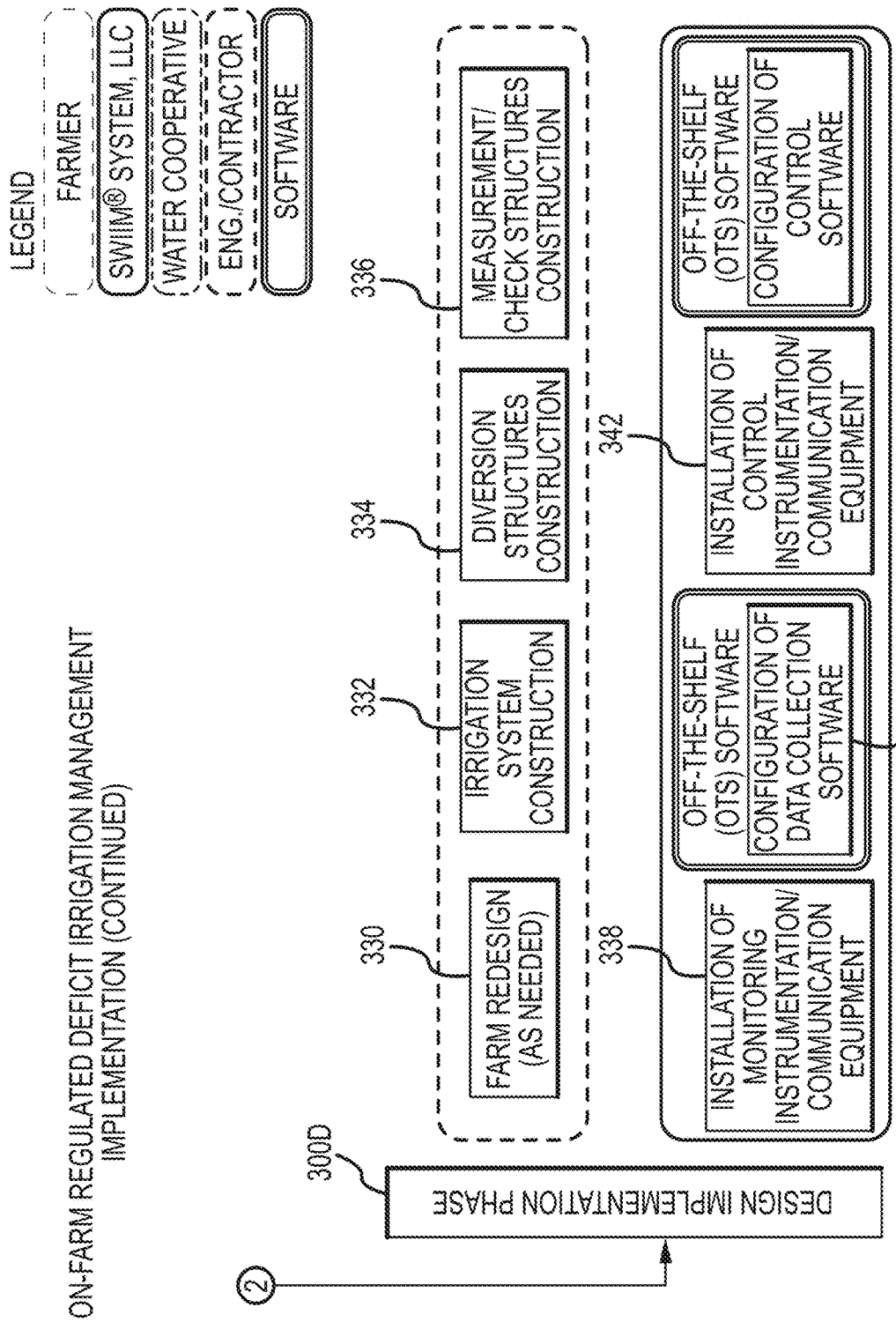
Figure 3:
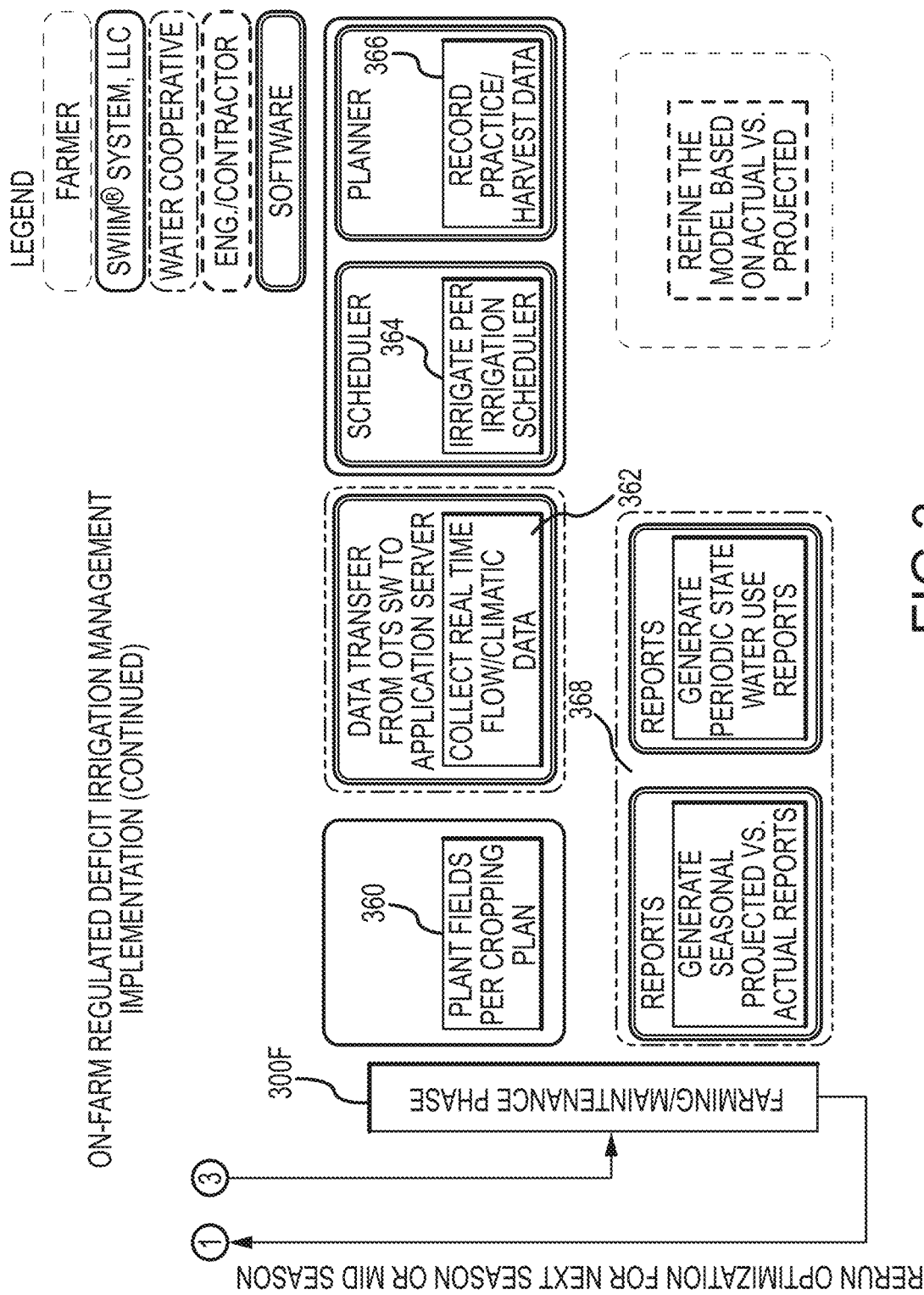

FIG. 3 is a schematic of an irrigation management implementation scheme 300 of one embodiment of the invention. Here, the system includes three distinct analytical phases. A planning/modeling phase 300P, a design implementation phase 300D, and a farming/maintenance phase 300F.

Figure 12:
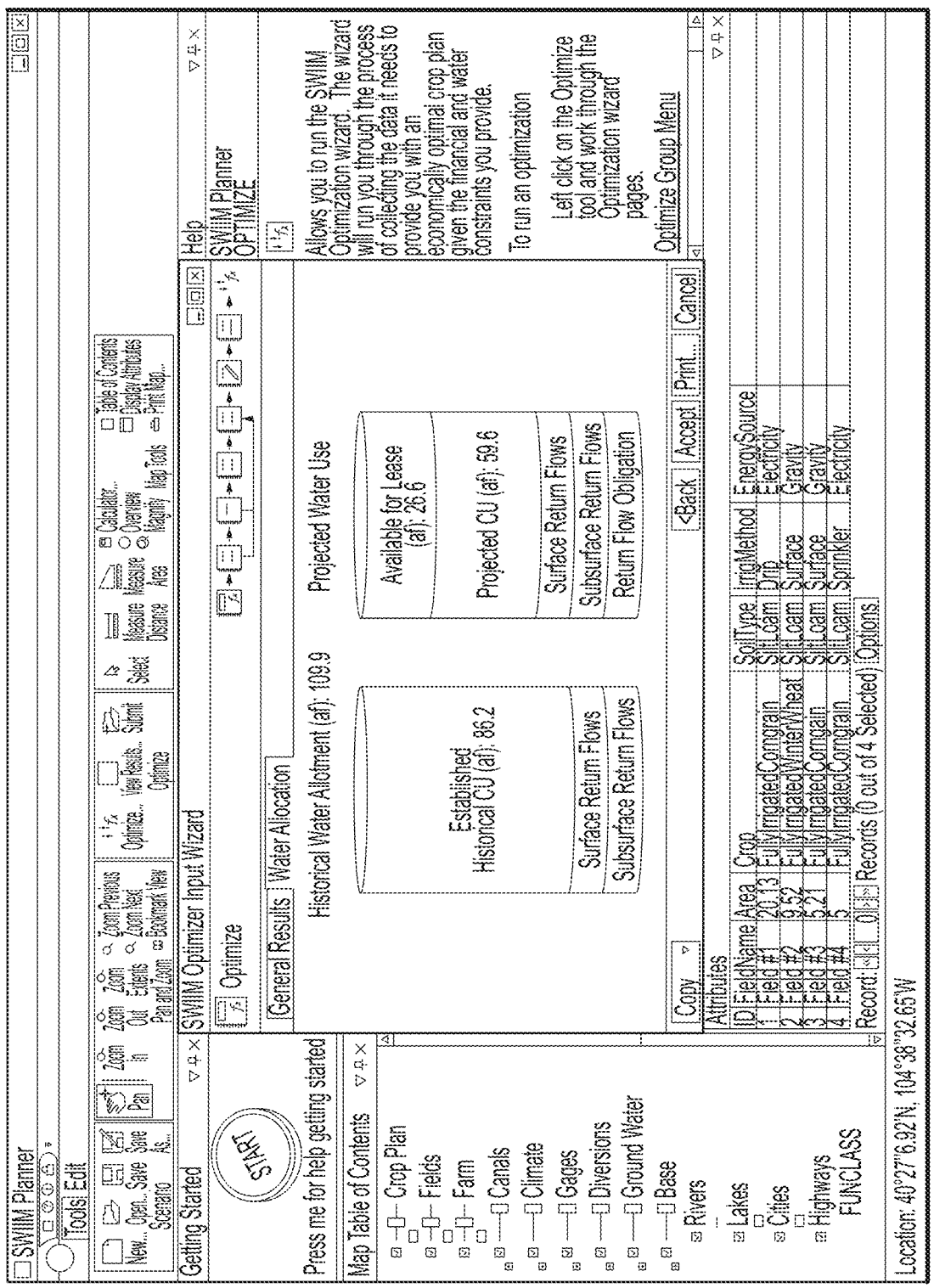
FIG. 12 is a graphical user interface showing the water allotment for an optimized land and water use plan generated by the planner of one embodiment of the present invention.

The planning/modeling phase 300P begins by having a farmer, or other user, input general data 302 about the farm, such as field information (FIG. 9), crops being grown (FIG. 10), etc. Historic farm practices 304 related to current irrigation and planting schedules are also inputted into the planning tool. Other model constraints 306 are then entered such as minimum and/or maximum crop areas, which crops a farmer is willing to grow on a field-by-field basis and limits on applied water. Next, an optimization tool 308 is run and desired model results 310 are generated. FIGS. 11 and 12 are examples of these results which will be discussed below. Alternative scenarios may be run by the farmer and be saved or discarded as the user wishes. The graphic, GIS map, and tabular inputs and outputs will be customized for particular use by the farm, regulators, ditch companies, etc.

The farmer must then assess whether existing farming or irrigation schemes should be changed 314. If changes to the system are made, the planning/modeling phase 300P is rerun. If aggregated model results from multiple farming operations 312 necessitate farm or ditch changes to support any subsequent lease and return flow requirements, the design implementation phase 300D of the system is commenced.

More specifically, during the planning/modeling phase 300P a farmer or farmers will use the planner to input relevant data into an optimizing module to provide at least one optimized cropping plan that maximizes income while meeting a prearranged water lease, sale, or alternative land use agreements. Using the planner's map interface, a farmer will be able to trace fields, preferred crop planting plans, and enter data required for the optimization process. The data required for the optimization process may include general farm data, historical farming practice data and other constraints required for the economic optimization model. The farmer will run the model and evaluate the results. If desired, the farmer can modify the constraints and rerun the model until satisfied with the results. Once satisfied with the proposed cropping plan, the farmer will submit it for the next planting year to a Water Cooperative, for example, for approval. In some instances the Water Cooperative will aggregate all of the farmers' cropping plans to ensure that the proper amount of irrigation water will be available to meet any prearranged water lease agreements. If there is a shortfall or excess water for lease, the Water Cooperative will work with selected farmers to adjust their plans accordingly. If a farmer has never leased a portion of irrigation water, changes may be required to the canal/on-farm delivery systems to handle recharge requirements, increase irrigation efficiency, etc. If changes are required, the tasks in the Design/Implementation Phase 300D may be required. Otherwise the annual Farming/Maintenance Phase 300F applies.

The design implementation phase 300 may include redesigning, adapting, or reconfiguring the farm(s) as needed 330, irrigation system 332 construction, water diversion structure 334 construction, and/or measurement and check structure 336 construction. New recharge structures at the farm or ditch level may be suggested as required by the plan. In this phase, instrumentation and communication equipment are also installed 338 and data collection software is implemented 340 to pull data from and/or push data to the monitors described above. Off-the-shelf systems used may include, but not be limited to, Rubicon Water's SCADA-Connect, Motorola's MOSCAD, and Campbell Scientific LoggerNet dataloggers and weather stations. Data may also be collected from existing weather data networks such as CoAgMet in Colorado, CIMIS in California, or other state or federally-supported data network. Controls and communications equipment are also installed 342. Off-the-shelf irrigation control systems used may include, but are not limited to, the Hunter Industries, Inc. ACC control system, Acclima, Inc. soil moisture sensors and controls, Baseline Controls, ET Water Systems, and Toro Irrigation controls. This phase of the system 300D positions the farm for monitoring required to support leasing any water as part of a water use change case.

Implementation of the optimized land and water use plans may comprise canal planning so that a portion of its water may be leased which may entail consultants/contractors to redesign or update the designs of existing irrigation systems, groundwater recharge systems, and water diversion structures. This analysis may require installation of new or upgraded measurement and/or check structures. To meet some reporting requirements to prove that water is being handled properly, Supervisory Control and Data Acquisition (SCADA)/weather station and other suitable instrumentation may be installed to monitor water inflow/outflows, calculate consumptive use (CU) and help accurately deliver water to fields in accordance with the cropping plans and water lease arrangements. Further, if a farmer has changed irrigation methods from surface irrigation to drip or sprinkler, the farmer will generally also install a control system to help schedule irrigations. The SCADA/weather station and control software systems contemplated herein will be configured to properly operate within the constraints of the new land and water use plan.

If the aggregate model results from multiple farming operations (cropping plans and water leases) 312 can be accommodated without any needed farm or ditch changes, the farming/maintenance phase 300F will commence, which requires planting the fields per the optimized land use plan 360 and collecting real-time temperature and climate data 362, for example. The irrigation schedule of the crops 364 will be set and the actual practices being performed will be recorded, which includes harvest data, etc. In the farming/maintenance phase 300F of the process, the system will also generally be tasked with generating a plurality of needed and/or desired reports 368 which often will be related to seasonal actual data and periodic water use. One skilled in the art will appreciate that the planning/modeling phase 300P may be run at any time to further optimize the planting and irrigation of a farm.

More specifically, assuming the infrastructure is in place to support the leasing of water (i.e., canal water delivery measurement and controls, consumptive use monitoring, groundwater recharge structures, etc.), farmers participating in a Water Cooperative will plant crops according to their cropping plan submitted to and agreed on by the Water Cooperative. The Water Cooperative will deliver the appropriate amount of water to the farmers and monitor, via the SCADA instrumentation, how much water is delivered to each farm, how much water runs off and calculate consumptive use on a regular basis. This constitutes a water balance monitoring approach of irrigation water and farm operations.

The manager's monitoring functionality will be used to monitor water budgets and plant physiology to determine possible irrigation schedules for the farm on a regular basis so the farmer can apply the proper irrigation amounts in accordance with an annual water budget associated with the farm. As farmers harvest crops they will use and tune a crop water production function and will be able to calibrate/improve the optimization curve used by planner. This will result in more accurate yield predictions in the Optimizer. The Water Cooperative will generate reports required by regulatory agencies as well as reports of projected versus actual results. As the system is used, the land and water use optimization model will be improved based on measured results.

Figure 4:
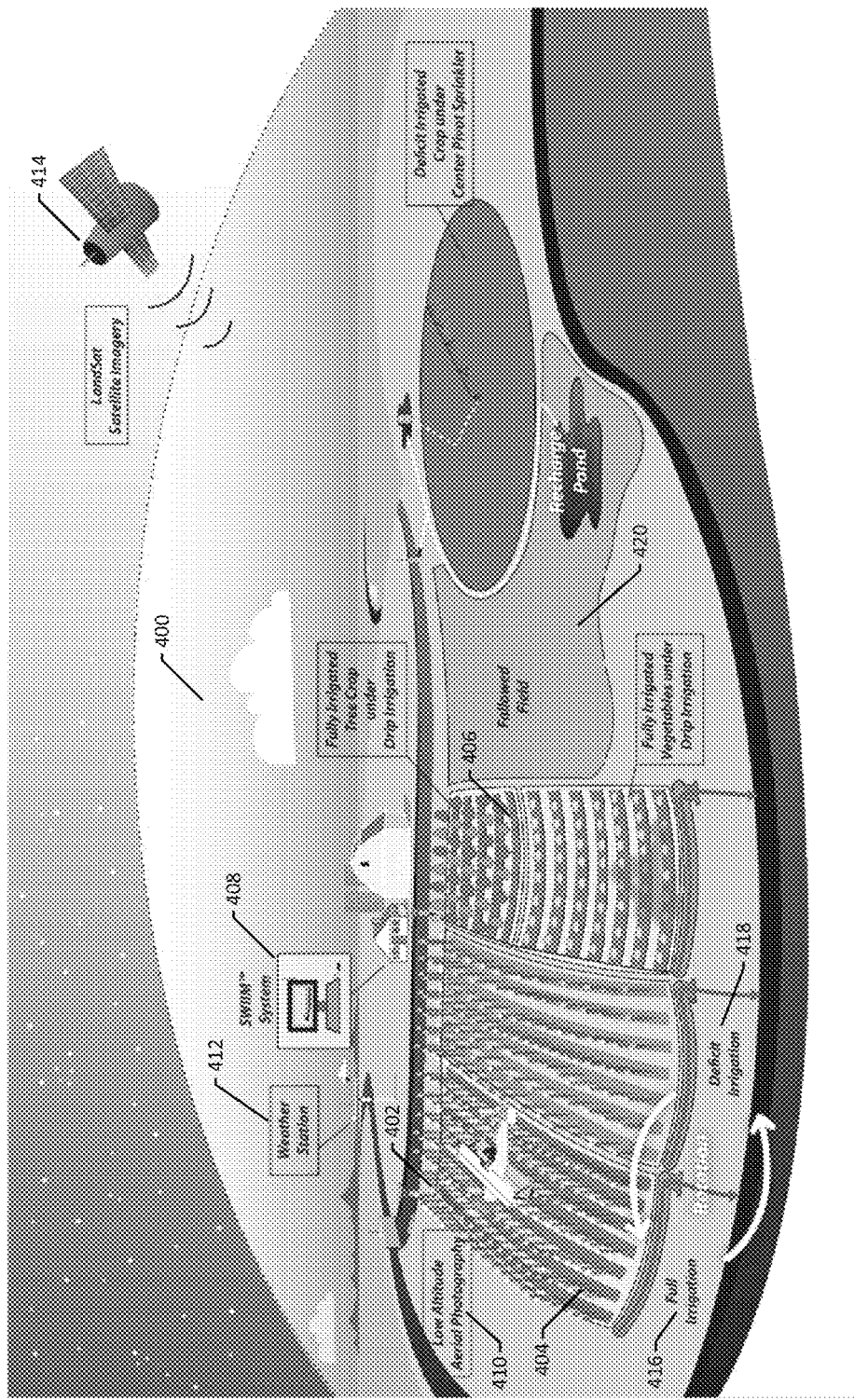
FIG. 4 is an illustration of a farm employing a monitoring system of one embodiment of the present invention.

FIG. 4 shows a monitoring system 400 that assesses water consumption associated with a given area. A monitor 402 having at least one sensor is positioned in or adjusted to a field 404 having a plurality of crops 406. The monitor 402 includes an antenna with wireless devices, for transmitting information to a centralized location 408 for assessment. The information may also be saved and/or forwarded to an offsite location for storage and analysis. Such transmissions may also be accomplished by traditional, i.e., non-wireless means (not shown). Information may also be obtained from aerial photography or sensing 410, local weather stations 412, ground level measurements, and satellite imagery 414.

In one embodiment, land and water use is optimized using inputs regarding farmer acceptable land use, etc. The outputted plan tells the farmer which fields to use full irrigation 416, which fields to use regulated deficit irrigation 418, and how to rotate the crops in those fields. Alternatively the planner will advise the farmer to fallow a field 420. The planning and scheduling functionality of the contemplated system allows the farmer to maximize profits as a function of crop yield and water allocation sales.

Figure 5:
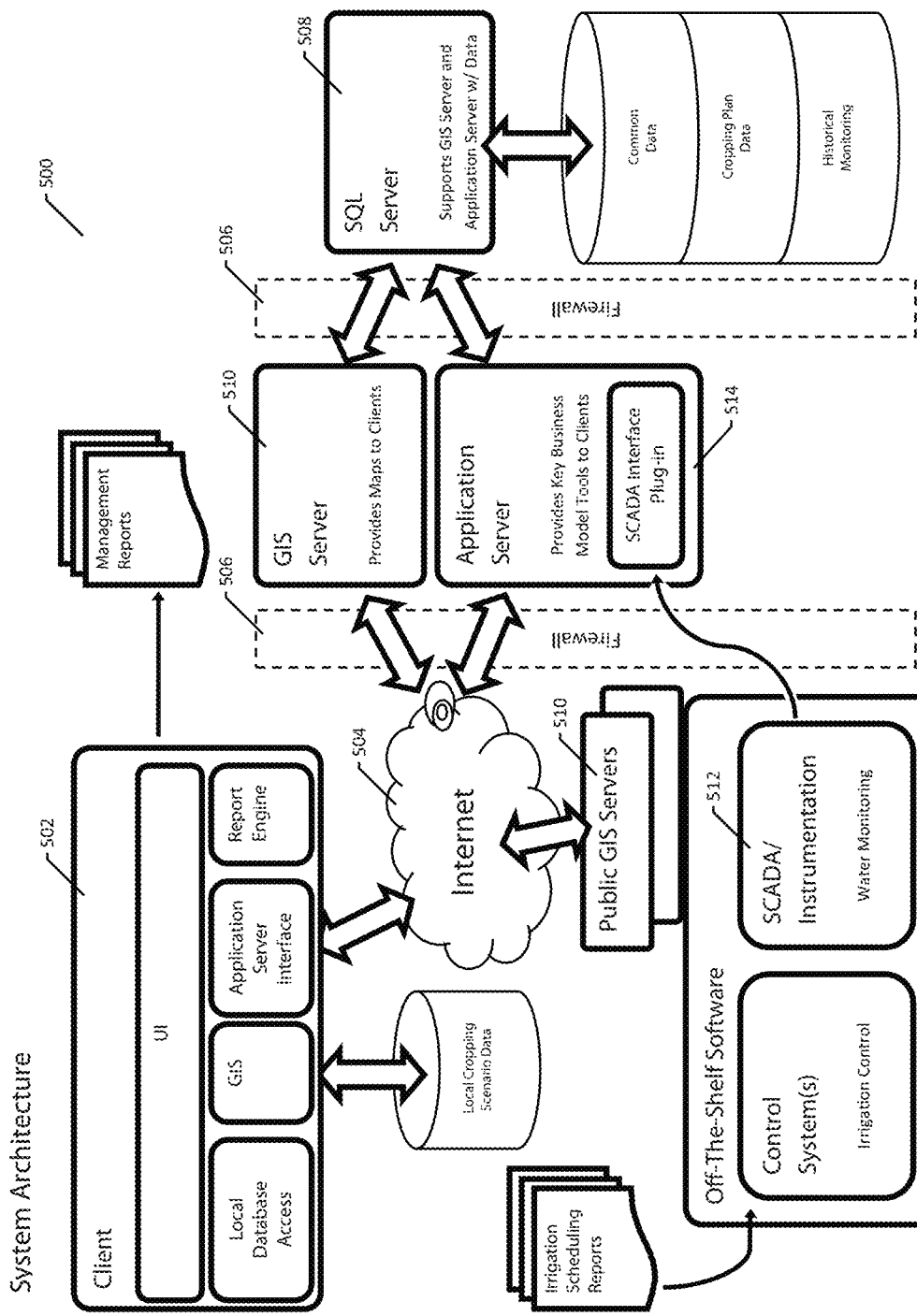
FIG. 5 is a schematic illustrating a system architecture used by one embodiment of the present invention.

Collected field data (water monitoring) is forwarded to a remote server (as shown in FIG. 5) and analyzed by the manager to assess the actual water needed to achieve or monitor a predetermined seasonal water budget. The system models base their results at least partially on crops being grown, water runoff, soil moisture, aerial and satellite data, and onsite data acquisition, which may include remote web-based cameras placed strategically throughout the sites being monitored, etc. It should also be understood that the system collects and sends data to and from various sensors, which can be stationary or mobile data gathering devices, via RF transmission protocols and related methods, or in other ways known by those of skill in the art. Instruments may communicate collected data to and receive data or instructions from a remote server, such as a hosted server (see FIG. 6), via any appropriate communications network, such as a network using an RF router, or supply information over an internet communication system.

The overall communication network which may be used with one embodiment of the disclosed system may, in fact, be any combination of circuit-switched, packet-switched, analog, digital, wired, and wireless communication equipment and infrastructure suitable for transmitting signals to a server. The communication network therefore may include one or more of the following: intranet, internet, a cellular communication system, a wireless data system, a publically switched telephone network, a private telephone network, a satellite communication system, or a point-to-point microwave system. Depending upon the particular communication network utilized, the system may send and receive signals in accordance with a wireless application protocol, FCC 802.11 standards, a proprietary protocol, or other types of communication protocols.

An example of a suitable wireless link between the system and a communication network is a wireless internet link wherein the data is routed to a hosted server based on an IP address. The server may decipher the incoming signals (which may or may not be encrypted) to extract appropriate data. The data may next be processed to generate information which can be displayed or otherwise presented to interested parties through various user interfaces (see FIG. 11). These user interfaces could, but need not be, a web browser application running on a computer connected to a server through the internet. Utilizing the manager, a user can access the server and view collected data, analyze data, generate reports, request that certain analysis be conducted, etc. Additional security and authentication mechanisms, as are generally known in the field, may also be utilized in some circumstances.

As will be understood by those of skill in the art, information could also be transmitted by the server or other devices of the system in any of the fashions identified above or as generally known. The host server could also include one or more input and output devices which may facilitate bidirectional flow of information between the overall system and the server and users or other devices. If data received from the remote site indicates fault conditions at the site being monitored, alarms or other notifications can also be triggered at the site, at the hosted server, or at another location. Further, instructions to address the alert condition can be sent where appropriate.

As shown in FIG. 5, users, i.e. farmers, access the system's client applications, i.e., the planner and the manager, in any conventional manner using any suitable communication device, including the internet, to constantly or periodically monitor their land and water use project, access reports, communicate with equipment that adjust certain equipment parameters, etc. Users typically will not, however, through use of appropriate security software, be allowed to monitor data collected on other projects which may also reside upon the global server.

In one embodiment of the present invention, users utilize work station computers or mobile devices to access the server and potentially save some site-specific data on the user's computer. These computing devices will typically include at least an output device, such as a video monitor or display, and an input device, such as a keyboard or computer mouse. Other types of input and output devices can be used in some circumstances. For example, the output device may include a speaker and the input device may include a microphone, a touch screen, joy stick, or touch pad. In accordance with known techniques, the computer will typically be connected to the internet. An example of a suitable connection includes establishing a communication link through an internet service provider and modem or other device connected to a communication infrastructure, such as a cable communication system or packet-switched telecommunication network. In some circumstances, other techniques could be used to establish a communication link between a user and the server. Other modern and suitable communication links are also envisioned.

A wireless communication system is employed by one embodiment which may include a cellular telephone system with packet-switched mobile data capabilities, such as ARDIS, RAM, or CDPD services. The systems provide a communication data packet formed offline and a header and error correction that is added before transmission. A dedicated communication link, therefore, need not be utilized. In some situations, a circuit-switched dedicated communication link may be used. For example, a dial-in wireless internet connection service over the cellular telephone system can be used for the wireless communication link. Some wireless communication systems, for example, provide wireless internet access with the user of a wireless modem that can be connected to a laptop computer, mobile computing device (smart phone), or personal digital assistant. The wireless communication system may utilize any communication protocol and modulation, such as, for example, co-division multiple access (CDMA), time-division multiple access (TDMA), advance mobile phone services (AMPS), general packet radio service (GPRS), or global system for mobile communications (GSM) in accordance with known techniques.

In some circumstances, a cellular voice channel may be used to transmit data to the server. In such a circumstance, the monitoring device or the overall system typically may establish a cellular call with the modem connected to a server, either directly or through a network. The call can be terminated after data has been transferred and reestablished as needed, or it may be maintained throughout the monitoring process.

As will be understood by those of skill in the art, it is thus contemplated that data collected by a monitor or to be sent to a monitor can be sent in analog or digital formats, and that appropriate circuitry can be utilized to convert the data between various available signal forms.

The general system architecture 500 of one embodiment of the present invention utilizes a general client server structure where any number of clients 502 (such as Windows® clients) work via the internet 504 with supporting servers 510 (such as hosted or GIS servers). In turn, the servers may preferably use a back-end SQL server 508 to store critical data, though those skilled in the art will understand that such critical data could also be stored in many other fashions, including on the primary servers. In one embodiment of the present invention, the SQL server 508 is firewalled 506 for added security of client data. In a preferred system, each client will store data locally and only forward necessary data to the application server 514 as required to implement and monitor a real change in water usage practices.

The term "SCADA" (acronym for Supervisory Control and Data Acquisition) as used in FIG. 5 is a generalization for not only SCADA systems, but also weather stations and other data collection software used in conjunction with the systems as contemplated in this disclosure.

SCADA plug-ins may be created on an as-needed basis. Each plug-in will provide summary operational data from a given SCADA system into the SQL Server database for management and reporting purposes. The server will provide the unique business model functionality of the invention including but not limited to the optimization model used to optimize farmer's cropping plans and irrigation water use. GIS data used by the system will come from several sources including but not limited to public sources of satellite and aerial photography, such as Bing, Google Maps, ESRI, or other internet based GIS tools for wide-area-canal, well, river, roads, etc. map layers. Finally, the farmer himself is a GIS data source for farm related crop practice data that will be stored locally on the farmer's own computer. In one embodiment of the present invention, the system will provide varying functionality according to the role of the user, which includes, but is not limited to farmers, ditch company administrators, and system administrators. The farmers through the system will have the general functionality of water and crop use planning, irrigation scheduling, and follow up reporting. Ditch company or water cooperative administrators will have the ability to plan a large scale crop and water use plan, water tracking, and regulatory water use reporting. The system administrator will have the functionality of the farmer and the irrigation specialist and further have the ability for general data maintenance and system performance and monitoring.

SCADA is fundamental to implementation of the concepts associated with one embodiment of the invention. Generic definitions are appropriate to help describe basic SCADA concepts. The "central system" is a microcomputer-based and interface software used to communicate with remote sites. The software that provides an umbrella over everything is called a "human-machine interface" or HMI. The remote sites include a "remote terminal unit" or RTU. The HMI software can be proprietary and published by the manufacturer of the hardware, or it can be more generic and published by software companies that write more generic HMI programs that are compatible with the hardware of many manufacturers. Flexible and broadly compatible software application programs are known as Wonderware, Lookout, and Intellution, as examples.

Figure 6:
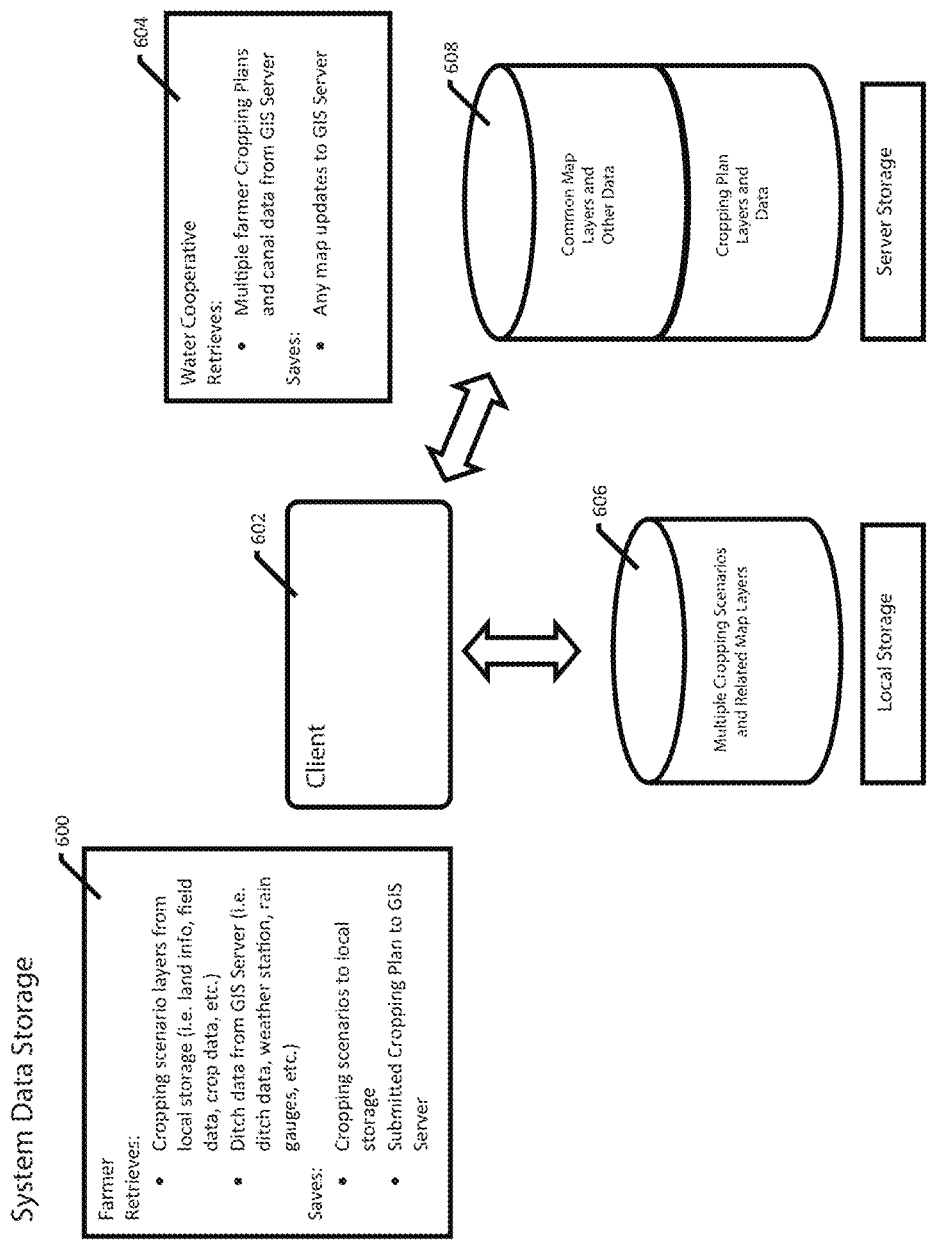
FIG. 6 shows a data storage system architecture used by one embodiment of the present invention.

As shown in FIG. 6, the system client applications 600 will store/retrieve key map data from both local storage 606 and from a central server 608 by way of the internet or other appropriate method. Various crop planting scenarios will be creatable by the farmer (user) and saved as separate maps wherein each crop planting scenario will have its own 'map'. The user will be able to duplicate a scenario, rename it, change some of the inputs and run a new analysis. The application 602 will retrieve common base layers from a GIS server 608 and the farmer's scenario layers from local storage 606. When a crop planting scenario is submitted as, for example, a "Farming Year 20—Cropping Plan", the heretofore local map layers 606 will be pushed to the server 608 where they will then be accessible by Water Cooperatives 604 for water management in keeping with state monitoring and reporting requirements associated with any water transfers.

As described above, the planner may work in concert with an optimization module that maximizes the economic value that factors in the farmer's consumptive use of water. Moreover, the optimizer, after analyzing various practices available to the farmer will assist in setting the stage for future farming operations that may have a favorable overall effect on the farmer's annual income. The optimizer of one embodiment considers the practices, or a combination of practices, that lend themselves to an annual consumptive use water budget scheme. For example, in any given year, practices may include: 1) regulated deficit irrigation; 2) introduction of new crops, including perennial crops; 3) permanent fallowing or rotational fallowing; 4) introduction of dryland crops; 5) continued full irrigation of selected crops; 6) crop rotations (implies multiple years); and 7) combinations thereof. In following years, a farmer might choose different combinations of these alternative practices.

Figure 7:
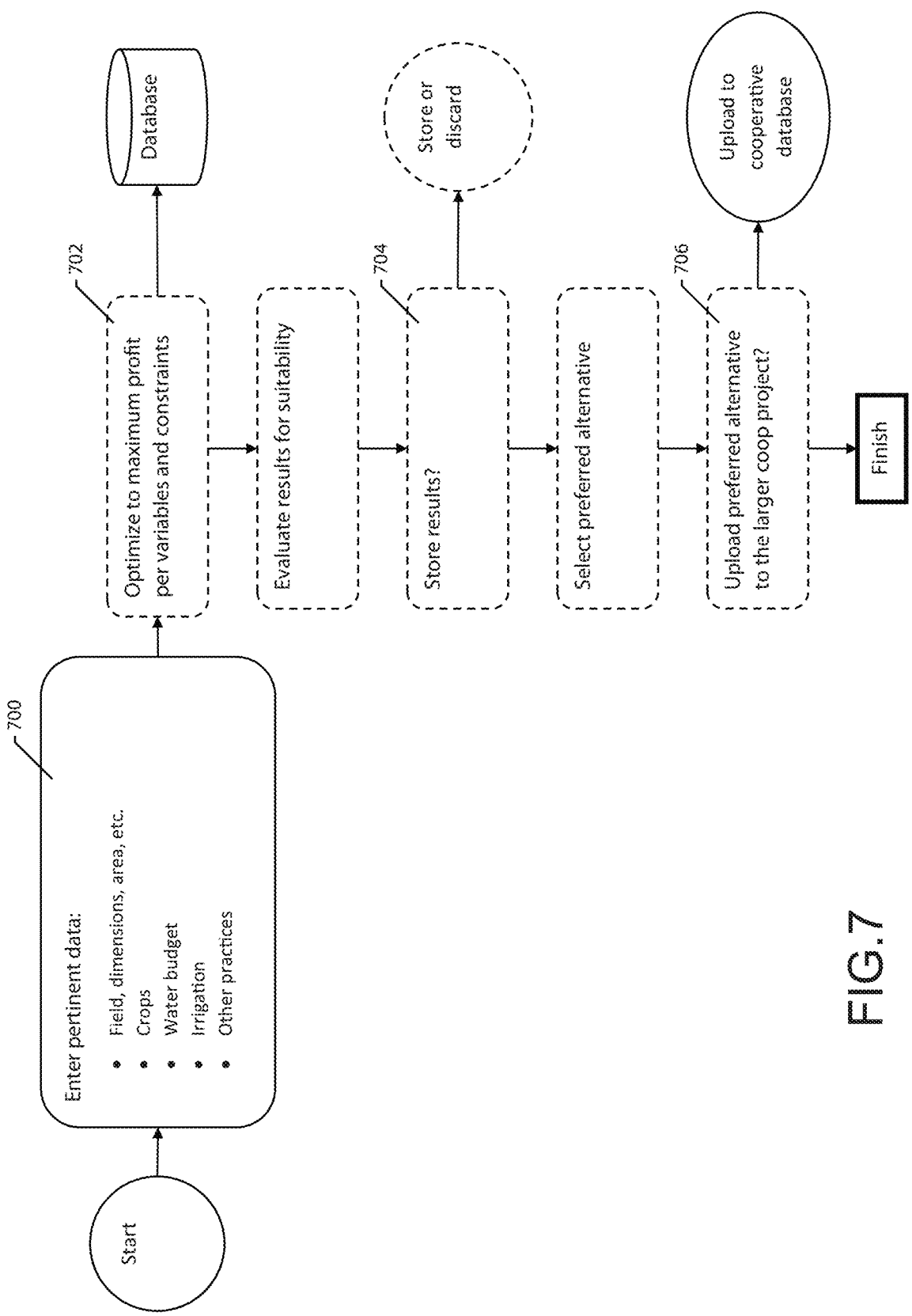
FIG. 7 planner optimization system flow.

The flow of user experience is conceptualized in FIG. 7. Here, the user enters or changes data 700 related to fields, crops, irrigation, and other practices, and then runs the optimization model. If the results of a particular optimization run 702 are of interest, then the results can be stored 704. When optimization of a particular parcel of land is finalized, the data generated can be uploaded 706 into a larger database for inclusion into larger operations plans that can be adopted by a ditch company or a cooperative operating entity.

The optimization model of one embodiment is broadly defined in consideration of the elements that characterize all mathematical optimization models, namely the parameters, decision variables, constraints, and the primary objective function. The objective function is defined for the purposes of this Model to be the maximized projected net returns to the farming operation. The optimizer is often tasked with identifying a land/water use plan that yields the highest "net return". "Net return" is generally defined as the income from an investment after deducting all expenses from the gross income generated by the investment. In a farming operation "net return" is defined to comprise farm revenues minus the fixed operating costs. Net return has also been more aptly defined as the return to land and management. Farm net returns, by definition, does not include land costs, interest, taxes, and other costs that are fixed regardless of irrigation decision.

Thus, as used herein, net returns=
  net crop price×crop yield
  minus irrigated crop production costs
  minus cost of water×depth of irrigation applied The decision variables used by the optimizer include assumptions and values for all inputs costs, crop yields, and crop prices. The optimizer may also use default decision variables, which may be obtained from the National Agricultural Statistics Service database (http://www.nass.usda-.gov/) but with minor inputs of data from other peripheral sources when the NASS database did not have the needed data. In some instances the defaults may be place holders that allow for quick data input. It is envisioned that the optimizer's input data obtained by the planner can easily be changed for farm-specific circumstances, or experience, or for that matter, contractual pricing that may be obligatory. One of skill in the art will also appreciate that the default data should also be changed when farm current market influences need to be recognized. Examples of significant influences are increased market price for corn as influenced by the decline of ethanol plant demands or increased price for wheat as influenced by Russian exports of wheat.

In one embodiment, the optimizer uses four categories of crops. Crop categories and the underlying assumptions with those crops are:

1. Full Irrigation (Enough irrigation to maximize yield or profit)
   Yield=f(crop, soil type)=constant
   Water for fully irrigated yield is f(crop, soil type) =constant
   Fixed production costs>0
   Variable production costs>0
   Price>0
2. Dryland (No irrigation)
   Yield=f(crop, soil type)
   Water=0
   Fixed production costs>0
   Variable production costs>0
   Price>0
3. Fallow (No crop, but weeds must be controlled after an establishment period so there are fixed production costs)
   Yield=0
   Water=0
   Fixed production costs>0
   Variable production costs=0
   Price=0
4. Deficit irrigation (The crop is irrigated with 10 to 90% of the amount of irrigation to achieve maximum yield in 10% bracketed increments)
   Yield=f(crop, soil type, irrigation method, irrigation): a nonlinear function
   Fixed production costs>0
   Variable production costs>0
   Price>0

The optimizer of one embodiment uses the following list of crops:

Fallow
Fully Irrigated Corn - grain
Fully Irrigated Corn - silage
Fully Irrigated Winter Wheat
Fully Irrigated Barley
Fully Irrigated Alfalfa
Fully Irrigated Pinto Beans
Fully Irrigated Sugarbeets
Fully Irrigated Onions
Fully Irrigated Cabbage
Fully Irrigated Carrots
Deficit Irrigated Corn - grain
Deficit Irrigated Corn - silage
Deficit Irrigated Winter Wheat
Deficit Irrigated Barley
Deficit Irrigated Alfalfa
Deficit Irrigated Pinto Beans
Deficit Irrigated Sugarbeets -continued Dryland Corn
Dryland Winter Wheat
Dryland Barley
Dryland Alfalfa
Dryland Canola
Dryland Sorghum
Dryland Millet
Dryland Sunflower One of skill in the art will appreciate that this list is not exhaustive and will be at least partially on market trends, legality of crop, climate etc. Further, some crops are not allowed (not listed) as "deficit irrigated" or "dryland" under the presumption that these crops would not be grown as a practical matter, in some areas, under deficit irrigated or dryland conditions.

In addition, the planner optimizer will take into account the farmer's preferences. For example, the farmer may require a minimum amount of acres of a certain crop to be grown, i.e., corn to feed cattle. Also, the farmer will not grow a crop if money will be lost, with the exception of fallowing. Thus, the farmer will be given preferences related to acceptable crop(s) he or she is willing to grow which can be input on a field by field basis.

The constraints associated with the optimizer include decisions and/or assumptions that are associated with the overall farm operation or the assumptions for the pending year under evaluation. Examples of constraints are: 1) the minimum and maximum acreage of the various crops to be grown; and 2) willingness to employ certain practices (deficit irrigation, fallowing, etc). FIG. 8 summarizes the primary elements of the optimization model and provides examples of defining equations.

Again, FIG. 1 graphically shows the inputs to the optimizer compared to the optimized (modeled) net return. A successful run of the optimizer indicates the projected net return 108 associated with the crops to be grown along with crop yields, the practices to be adopted, and the anticipated unit prices 106. This modeled net return can then be contrasted with the historic net return 104 from the farming operation.

Mathematically, the equations employed by the optimizer of one embodiment are expressed by the following series of equations with the associated variables defined in Tables 1-3 provided below:

$$NR_{farm} = \sum_{f=1}^{nfld} fldsize_f \cdot \left\{ \begin{array}{l} \sum_{ndi=1}^{numNDI} \{selNDI_{f,ndi} \cdot NR_{f,ndi}\} + \\ \sum_{di=1}^{numDI} \sum_{s=1}^{numDIWat} \{selNDI_{f,di} \cdot selDIWat_{f,s} \cdot NR_{f,di,s}\} - \\ \left[1 - \sum_{ndi=1}^{numNDI} selNDI_{f,ndi} - \sum_{di=1}^{numDI} selDI_{f,di}\right] \cdot falcost \end{array} \right\}$$

Where:
Net return for the farm (NR farm) is the field size times the net return per acre for the field for non-deficit irrigated crops (first term), deficit irrigated crop (second term), and fallow (third term).

Net return for the field is net return of the non-deficit irrigated crop (NRf,ndi), if grown (selNDIf,ndi=1 for some ndi),

OR net return of the deficit irrigation crop (NRf, di,$) at the selected level of deficit irrigation (selDIWatf,s=1 for some s), if grown (selDIf,di=1 for some di),

OR the cost of fallow if no crop is grown (selNDIf,ndi=0 for all ndi and selDIf,di=0 for all di).

Net return for a field f and a crop (ndi or di) is net return minus the fixed costs for the crop minus the variable costs of irrigation minus the fixed costs of irrigation.

NRf,ndi is net return for NDI crop ndi in field f:

$$NR_{f,ndi} = [p_{ndi} - vc_{ndi}] \cdot yld_{f,ndi} - fc_{ndi} - [nir_{f,ndi}/aeff_f] \cdot vic_f - fic_f$$

Where: nirf,ndi is net irrigation requirement for full yield of crop ndi in field f. NRf,di,s is net return for a deficit irrigation (DI) crop di in field f with deficit irrigation water level s. For deficit irrigated crops, the yield and the variable costs of irrigation depend on the irrigation(s) selected.

$$NR_{f,di,s} = [p_{di} - vc_{di}] \cdot yld_{f,di} \cdot ryld_{f,s} - [nir_{f,di}/aeff_f] \cdot rirr_s \cdot vic_f - fic_f \cdot fc_{di}$$

In this equation, the relationship between yield and irrigation is described as a relationship between the proportion of net irrigation requirement of the crop and proportion of full yield (yield if net irrigation requirement of the crop is fully met). In other words, the crop water production function is defined as ryld~rirr. More specifically, the crop water production function is incorporated in the model as numDIWat paired values of ryld and rirr.

When all of the mathematical detail described above is combined into one equation:

$$NR_{farm} = \sum_{f=1}^{numfld} fldsize_f \cdot \left\{ \sum_{ndi=1}^{numNDI} \{selNDI_{f,ndi} \cdot [[p_{ndi} - vc_{ndi}] \cdot yld_{f,ndi} - fc_{ndi} - [(nir_{f,ndi}/aeff_f)] \cdot vic_f - fic_f]\} + \sum_{di=1}^{numDI} selDI_{f,di} \cdot \left[ \sum_{s=1}^{numDIWat} \left\{ selDIWat_{f,s} \cdot \left[ [p_{di} - vc_{di}] \cdot yld_{f,di} \cdot ryld_{f,s} - \left[\frac{nir_{f,di}}{aeff_f}\right] \cdot rirr_{f,s} \cdot vic_f \right] \right\} - fic_f - fc_{di} \right] - \left[ 1 - \sum_{ndi=1}^{numNDI} selNDI_{f,ndi} - \sum_{di=1}^{numDI} selDI_{f,di} \right] \cdot falcost \right\}$$

Decision variables are binary: $selNDI_{f,ndi}$; $selDI_{f,di}$; $selDIWat_{f,s}$, and are based on a farmer decision on whether to grow a crop in a given field:

$selNDI_{f,ndi} \leq willNDI_{f,ndi}$ for all ndi, f $selDI_{f,di} \leq willDI_{f,di}$ for all di, f The optimizer also places a limit on the amount of water available pursuant to the following formula:

$$\sum_{f=1}^{numfld} \left\{ \frac{fsize}{aeff_f} \cdot \left[ \sum_{ndi=1}^{numNDI} \{selNDI_{f,ndi} \cdot nir_{f,ndi}\} + \sum_{di=1}^{numDI} \left\{ selDI_{f,di} \cdot nir_{f,di} \cdot \sum_{s=1}^{numDIWat} \{selDIWat_{f,s} \cdot rirr_{f,s}\} \right\} \right] \right\} \leq \text{total irrigationwater}$$

Further optimizer assumes a maximum of one crop per field:

$$\sum_{ndi=1}^{numNDI} \{selNDI_{f,ndi}\} + \sum_{di=1}^{numDI} \{selDI_{f,di}\} \leq 1 \text{ for all } f$$

The constraint below indicates that an irrigation level ($selDIWat_{f,s}=1$ for some s) is selected for a field only if a DI crop is grown in a field ($selDI_{f,di}=1$ for some di).

For a field, if $selDI_{f,di}=0$ for all di then $selDIWat_{f,s}$ must be equal to zero for all s. Sum of $selDI_{f,di}$ for all di has a maximum of one, so sum of $selDIWat_{f,s}$ has a maximum of one.

$$\sum_{s=1}^{numDIWat} \{selDIWat_{f,s}\} \leq \sum_{di=1}^{numDI} \{selDI_{f,di}\} \text{ for all } f$$

Another constraint in that the crops must meet the farmer's minimum and maximum acreage:

$$minac_{ndi} \leq \sum_{f=1}^{numfld} \{fldsize_f \cdot selNDI_{f,ndi}\} \leq maxac_{ndi} \text{ for all } ndi$$

$$minac_{di} \leq \sum_{f=1}^{numfld} \{fldsize_f \cdot selDI_{f,di}\} \leq maxac_{di} \text{ for all } di$$

The farmer's wishes as to the minimum and/or maximum number of acres of fallow is considered by using the following equation:

$$minac_{fallow} \leq \sum_{f=1}^{numfld} \{fldsize_f \cdot [1 - selNDI_{f,ndi} - selNDI_{f,di}]\} \leq maxac_{fallow}$$

Finally, the optimizer dictates that the return from any crop must cover operating costs (NR>0):

$$\sum_{ndi=1}^{numNDI} \{selNDI_{f,ndi} \cdot NR_{f,ndi}\} + \sum_{di=1}^{numDI} \{selDI_{f,di} \cdot NR_{f,di}\} \geq 0 \text{ for all } f$$

OR the net return from any crop must be greater than the cost of fallow:

$$\sum_{ndi=1}^{numNDI} \{selNDI_{f,ndi} \cdot NR_{f,ndi}\} + \sum_{di=1}^{numDI} \{selDI_{f,di} \cdot NR_{f,di}\} \geq 0 \text{ for all } f$$

TABLE 1

Model Input Variable Descriptions.

| Name | Units | Description | Type |
|---|---|---|---|
| di | index | Index for deficit irrigated crops | index |
| f | index | Index for field | index |
| ndi | index | Index for non-deficit irrigated crops includes fully-irrigated and dryland | index |
| numDIWat | index | Number of levels (s) of water production functions ($ryld_s \sim rirr_s$) | index |
| s | index | Index for levels (steps) of net irrigation that can be selected for a DI crop; also the index to the associated relative yield | index |
| $aeff_f$ | proportion (no units) | Application efficiency for irrigation system on field f (water delivered to field*application efficiency is the water available to the crop); $0 \leq aeff_f \leq 1$ | parameter |
| $nir_{f,di}$ | ac-ft/ac | Seasonal net irrigation requirement for maximum yield of DI crop di in field f | parameter |
| $nir_{f,ndi}$ | ac-ft/ac | Seasonal net irrigation requirement for NDI crop ndi; if ndi is a dryland crop then $nir_{f,ndi} = 0$; | parameter |
| numDI | integer | Number of DI crops in the model | parameter |
| numNDI | integer | Number of NDI crops in the model | parameter |
| $rirr_{f,s}$ | proportion - no units | Relative irrigation in field f associated with s; This level is selected if $SelDIWat_s = 1$. Theoretically $0 \leq rirr_s \leq 1$ but we may put reasonable limits on it to help get the correct decisions | parameter |
| $ryld_{f,s}$ | proportion - no units | Relative yield of crop di in field f as indexed by s; $0 \leq ryld_{f,s} \leq 1$ | parameter |
| $yld_{f,di}$ | yield units/ac | Maximum possible yield of crop DI in field f | parameter |
| $yld_{f,ndi}$ | yield units/ac | Yield of crop ndi in field f (ndi crop may be fully irrigated or dryland crop) | parameter |
| $NR_{f,di,s}$ | $/ac | Net return if DI crop di is grown on field f | parameter |
| $NR_{f,ndi}$ | $/ac | Net return if NDI crop ndi is grown on field f | parameter |

TABLE 2

Model Optimization Variable Descriptions.

| Name | Units | Description | Type |
|---|---|---|---|
| $selDI_{f,di}$ | binary | 1 if NIDI crop ndi is selected for field f; 0 if not | decision variable |
| $selDIWat_{f,s}$ | binary | 1 if this level s of deficit irrigation is chosen for field f; 0 otherwise | decision variable |
| $selNDI_{f,ndi}$ | binary | 1 if NIDI crop ndi is selected for field f; 0 if not | decision variable |
| $NR_{farm}$ | $/farm | Net return from farm | Objective |

TABLE 3

Model Component Variable Descriptions.

| Name | Units | Description | Type |
|---|---|---|---|
| di | index | Index for deficit irrigated crops | index |
| f | index | Index for field | index |
| ndi | index | Index for non-deficit irrigated crops includes fully-irrigated and dryland | index |
| numDIWat | index | Number of levels (s) of water production functions ($ryld_s \sim rirr_s$) | index |
| s | index | Index for levels (steps) of net irrigation that can be selected for a DI crop; also the index to the associated relative yield | index |
| $aeff_f$ | proportion (no units) | Application efficiency for irrigation system on field f (water delivered to field*application efficiency is the water available to the crop); $0 \leq aeff_f \leq 1$ | parameter |
| $nir_{f,di}$ | ac-ft/ac | Seasonal net irrigation requirement for maximum yield of DI crop di in field f | parameter |
| $nir_{f,ndi}$ | ac-ft/ac | Seasonal net irrigation requirement for NDI crop ndi; if ndi is a dryland crop then $nir_{f,ndi} = 0$; | parameter |
| numDI | integer | Number of DI crops in the model | parameter |
| numNDI | integer | Number of NDI crops in the model | parameter |
| $rirr_{f,s}$ | proportion - no units | Relative irrigation in field f associated with s; This level is selected if $SelDIWats = 1$. Theoretically $0 \leq rirr_s \leq 1$ but we may put reasonable limits on it to help get the correct decisions | parameter |
| $ryld_{f,s}$ | proportion - no units | Relative yield of crop di in field f as indexed by s; $0 \leq ryld_{f,di,s} \leq 1$ | parameter |
| $yld_{f,di}$ | yield units/ac | Maximum possible yield of crop DI in field f | parameter |
| $yld_{f,ndi}$ | yield units/ac | Yield of crop ndi in field f (ndi crop may be fully irrigated or dryland crop) | parameter |
| $NR_{f,di,s}$ | $/ac | Net return if DI crop di is grown on field f | parameter |
| $NR_{f,ndi}$ | $/ac | Net return if NDI crop ndi is grown on field f | parameter |

In this example, dryland crops are included within the optimization as non-deficit irrigation NDI crops. Crop water production functions are handled as a simple lookup table for two reasons: 1) avoiding concerns of a linear versus non-linear function in the optimization; and 2) water production functions from any source can be easily entered by the user and including crop production functions brought about by a farmer's personal experience gained from operating a plan. In a similar way, new crop varieties including trial varieties can be entered and considered.

In operation, the optimizer utilizes farmer/user inputs to mathematically optimize future farming operations against a quantified or presumed consumptive use water budget associated with the farm. To outline the farm and existing or proposed fields, one embodiment of the planning tool allows the farmer to simply "point and click" boundary points over aerial or satellite images of their farm. The farmer then inputs information related to acceptable crops and irrigation practices that the farmer is willing to consider by field. Practices for farmer-consideration include full irrigation, deficit irrigation, dryland crops, and fallowing. Default values for crop market price and per crop input costs are used or any of the default inputs can be changed as may be desirable from the farmer's experience or perspective. When finished, the farmer has a precise computer-generated map of the farm that becomes the basis for planning and running scenarios.

A mathematical optimization is performed that is based on the farmer's inputs to provide a scenario that can be named and saved. Optimization output data compares historical net revenues with the forecast of net revenues based on the scenario. The forecast of net revenues will likely be less than the historic net revenues but the lease value of the consumptive use water is forecast as well. The lease value of the water, when added to the forecast net revenues, will likely exceed the historic net return.

As the end user of the planner may be a farmer and not an engineer or expert in the use of the planning and optimization systems, a "friendly" interface, i.e., an interface that does not require much financial data collection beyond what the farmer inherently knows about their own operations and which does not require searching for historical files or data to be gathered. Further, the mathematical underpinning of the optimizer is intended to be completely behind the scenes and essentially veiled by the user interface, because it is assumed that farmer users are not concerned with the inner workings of the optimizer. That is, farmer users want believable and understandable results against which they can do some "what if" thinking and make decisions about the upcoming cropping year.

Figure 9:
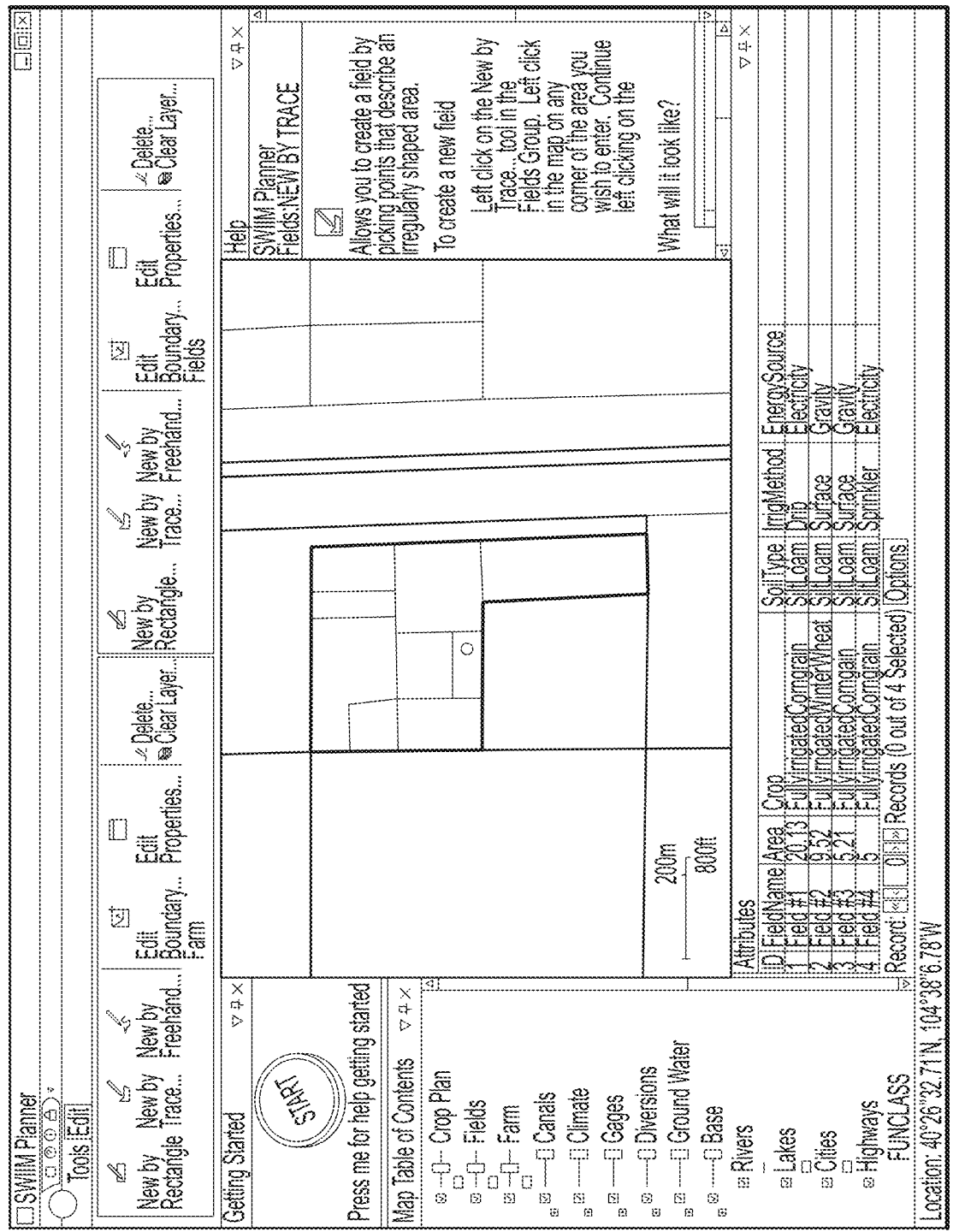
FIG. 9 shows a graphical user interface associated with inputting current field farming practices in the planner of one embodiment of the invention.
Figure 10:
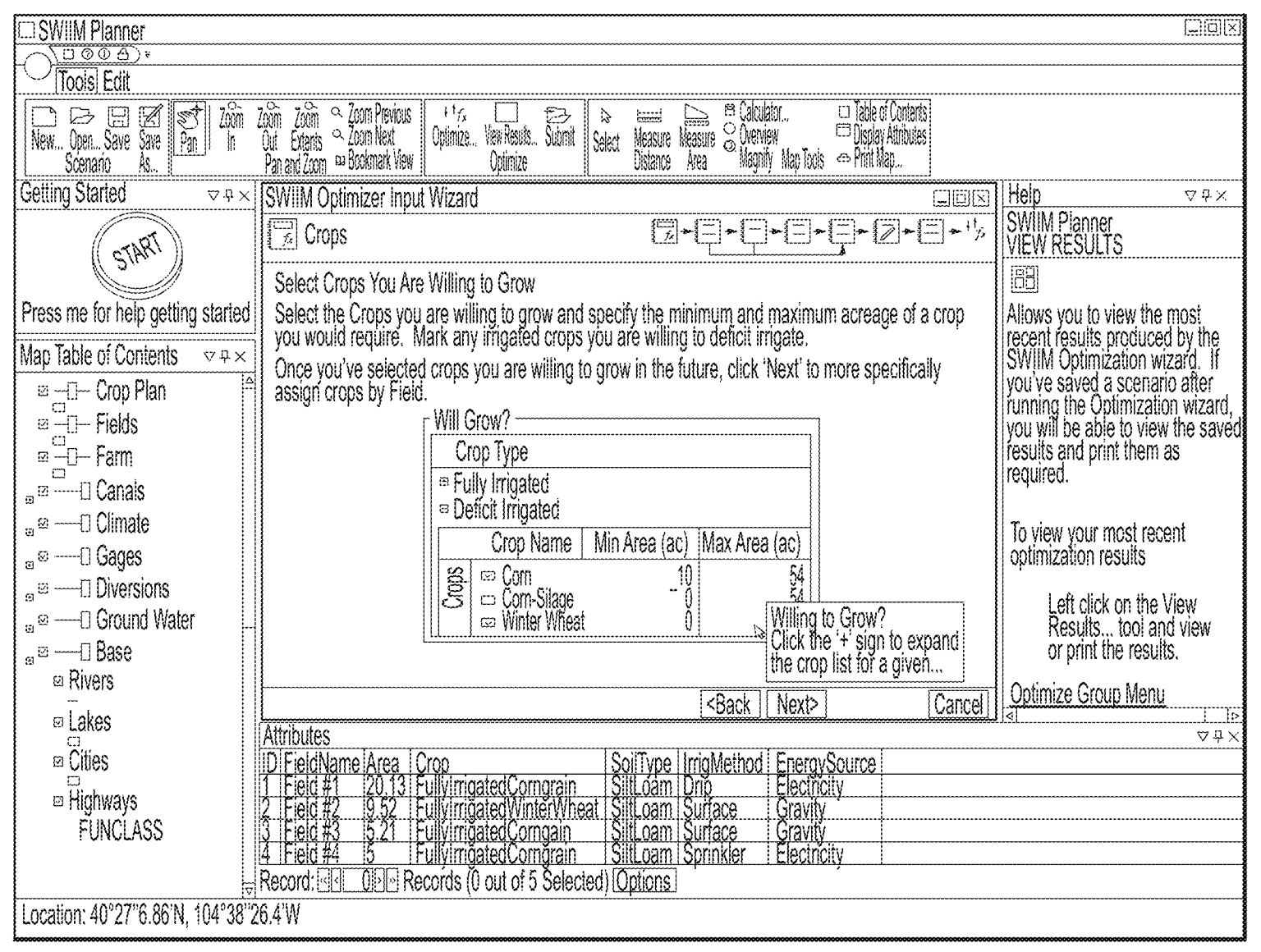
Figure 11:
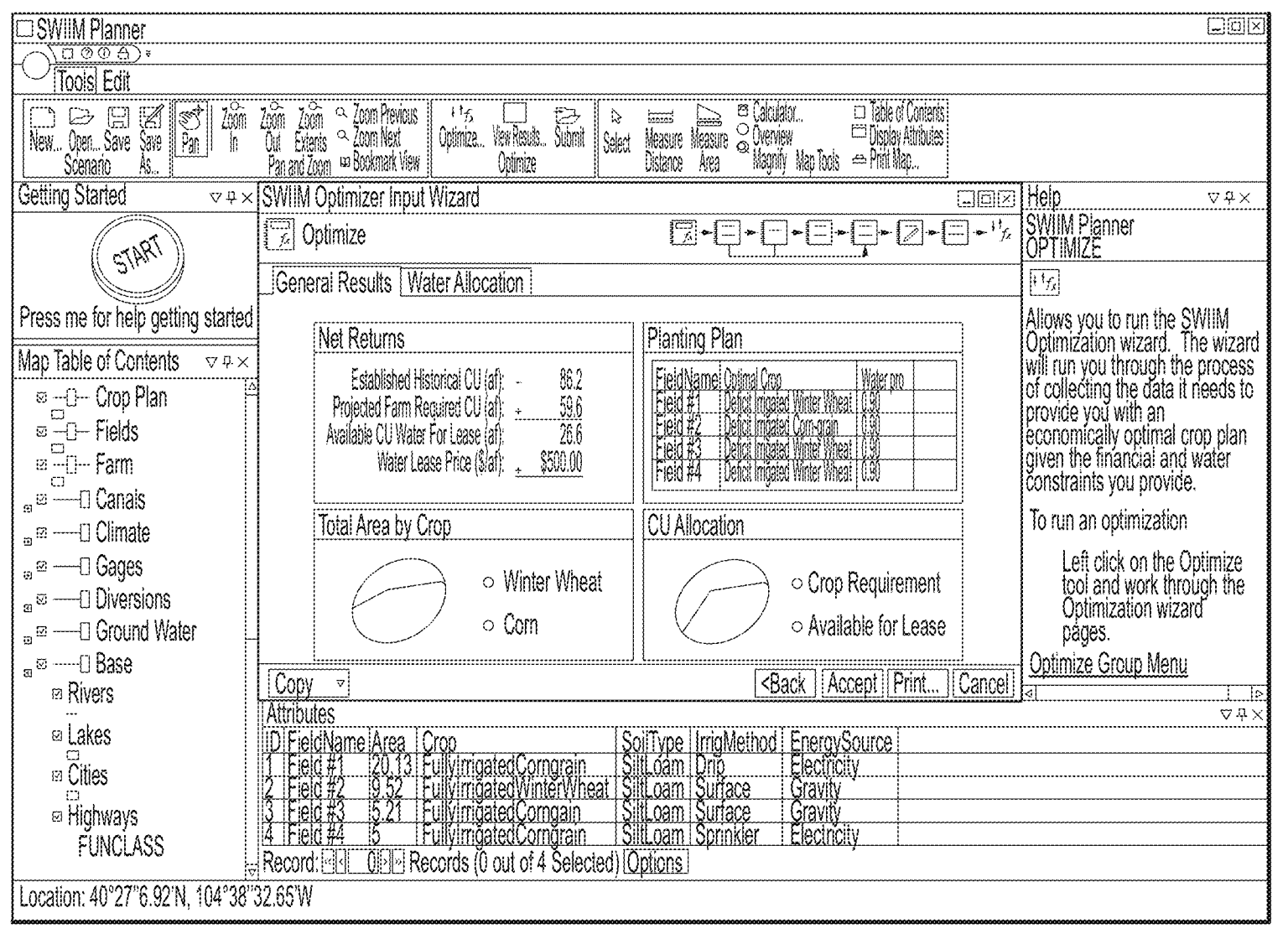

FIGS. 9-12 show screen captures of the planner of one embodiment of the present invention. FIG. 9 shows a geographic information system (GIS) style field data entry screen. The user does not need to know a GIS program or input features to input field data into the system. Data entry is facilitated by using intuitive point and click tools to overlay the land boundaries over an aerial or satellite photograph. Field boundaries can be input, color coded, named, and resultant acreage returned. The input screen can be set up to show attributes of interest by selecting suitable layers from the list shown on the left side of the map. FIG. 10 shows a user interface for inputs of crops that the farmer is willing to grow along with the acceptability, or not, of certain practices by the farmer. Also, note the input of maximum and minimum acreage for both irrigated and dryland crops is entered via this interface.

FIG. 11 shows reported results of the optimization run and indicates the projected net return as a function of the farmer's inputs.

FIG. 12 shows reported water allotment for a given optimization scenario and depicts how the historical CU is split into projected CU and water available for lease. In addition, it depicts the need to maintain historical return flows (return flow obligation).

FIG. 13 shows an example of monitored results that are provided by SWIM Manager. These results can be used to generate customized reports.

Figure 14:
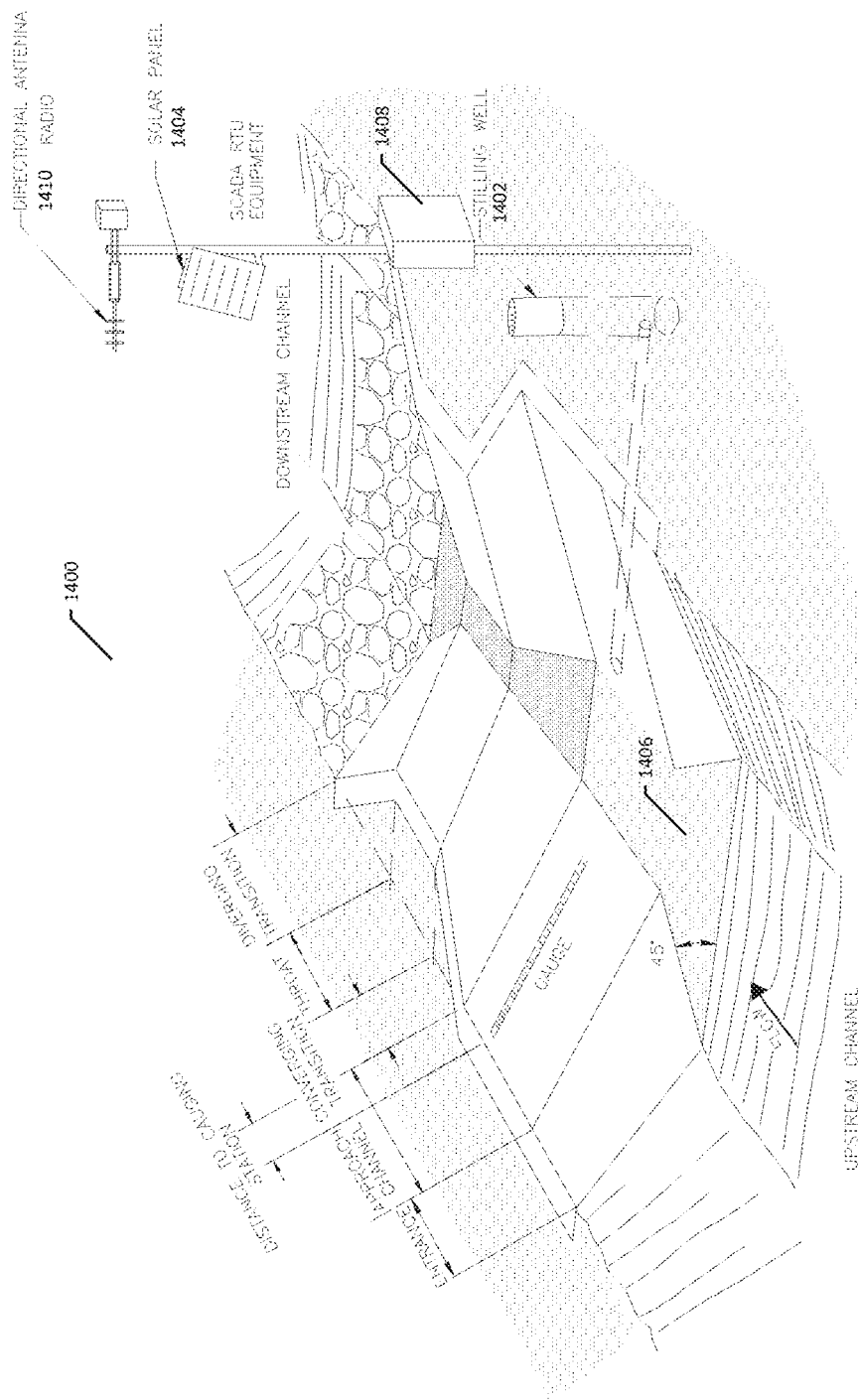
FIG. 14 shows a system for monitoring water flow from a parcel of land to a channel.

Referring now to FIG. 14, a system for monitoring the water flow 1400 from or to a parcel of land is shown. Here, a stilling well 1402 is positioned adjacent to a channel 1406. The stilling well 1402 is associated with a solar-powered 1404 remote terminal unit (RUT) 1408. The RUT 1408 also includes a radio 1410 for communication with the SWIM Manager or mobile data unit described above. In operation, water entering the stilling well 1402 is monitored and data associated with water flow is sent via the RTU 1408 to the SWIM Manager, for example.

Remote terminal units as discussed in FIG. 14 may be essentially a computer that can be programmed for the specific requirements at individual sites. The RTU is also generally the point at which sensors are connected. A site with only one requirement, e.g. monitoring the water surface elevation in a flume or weir, would have a water level sensor wired to it. The RTU then communicates to the central system, or conversely, the central system can initiate a time-driven call to the RTU. The RTU can be monitoring one or more sensors, perform logical operations, and create an exception report or alarm. If flows or water levels exceed a pre-set limit at a point in the canal system, an alarm can be raised or action can be taken in the form of gate or check adjustments. Alarms can appear at the central computer or even be transmitted to a mobile phone or pager.

Figure 15:
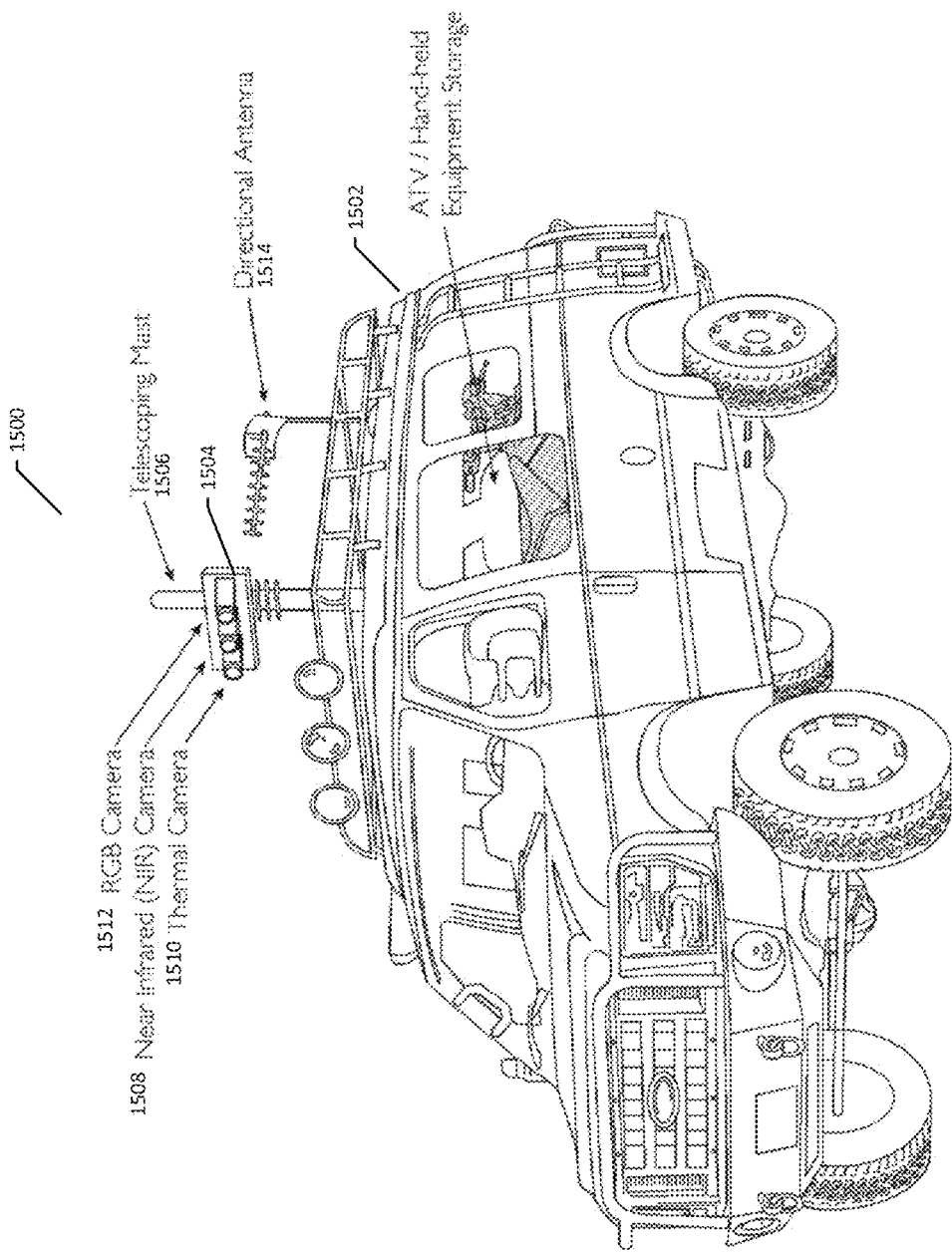
FIG. 15 is an illustration of mobile sensors and instruments employed by one embodiment of the present invention.

FIG. 15 shows a mobile data gathering system 1500 that is comprised of a vehicle 1502 that employs a plurality of data gathering tools. More specifically, one embodiment of the present invention employs a data gathering array 1504 with associated GPS locator mounted on a telescoping mast 1506. The array includes near infrared (NIR) cameras 1508, thermal cameras 1510, traditional RGB cameras 1512 and other associated equipment. The mobile data gathering system 1500 also includes an antenna 1514 to facilitate transfer of data to and from the monitors. In operation, at least a portion of the sensors are connected to wireless transmission devices that can transfer data to a central data collection location. It is envisioned that the equipment integrated onto the vehicle will be dismountable to allow for handheld operations if the monitors are located in difficult-to-access areas. One skilled in the art will appreciate that the mobile data gathering system 1500 vehicle may be a land based vehicle, an aircraft, or a satellite, for example. Data collected on the ground may be used to calibrate remotely sensed imagery.

Figure 16:
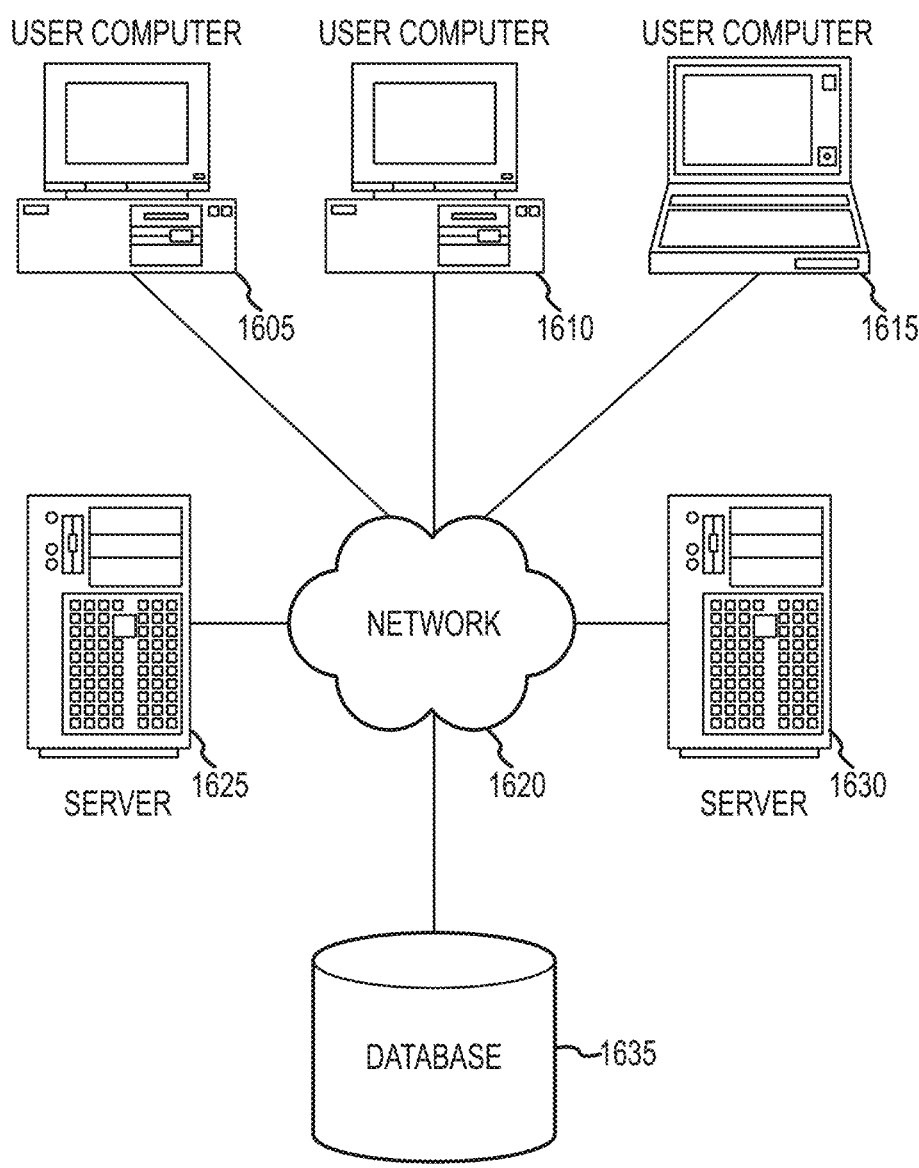
FIG. 16 is a schematic showing a computer network used by some embodiments of the present invention.

One of skill in the art will appreciate that the methods described herein may be performed by a computer via a web service. FIG. 16 illustrates a block diagram of a system 800 that may use a web service connector to integrate an application with a web service. The system 800 includes one or more user computers 805, 810, and 815. The user computers 805, 810, and 815 may be general purpose personal computers (including, merely by way of example, personal computers and/or laptop computers running various versions of Microsoft Corp.'s and/or Apple Corp.'s operating systems) and/or workstation computers running any of a variety of commercially-available UNIX or UNIX-like operating systems. These user computers 805, 810, 815 may also have any of a variety of applications, including for example, database client and/or server applications, and web browser applications. Alternatively, the user computers 805, 810, and 815 may be any other electronic device, such as a tablet computer, internet-enabled mobile telephone, and/or personal digital assistant, capable of communicating via a network (e.g., the network 820 described below) and/or displaying and navigating web pages or other types of electronic documents. Although the exemplary system 800 is shown with three user computers, any number of user computers may be supported.

The system 1600 further includes a network 1620. The network 1620 can be any type of network familiar to those skilled in the art that can support data communications using any of a variety of commercially-available protocols, including without limitation TCP/IP, SNA, IPX, AppleTalk, and the like. Merely by way of example, the network 1620 may be a local area network ("LAN"), such as an Ethernet network, a Token-Ring network and/or the like; a wide-area network; a virtual network, including without limitation a virtual private network ("VPN"); the internet; an intranet; an extranet; a public switched telephone network ("PSTN"); an infra-red network; a wireless network (e.g., a network operating under any of the IEEE 802.11 suite of protocols, the Bluetooth® protocol known in the art, and/or any other wireless protocol); and/or any combination of these and/or other networks.

The system may also include one or more server computers 1625, 1630. One server may be a web server 1625, which may be used to process requests for web pages or other electronic documents from user computers 1605, 1610, and 1620. The web server can be running an operating system including any of those discussed above, as well as any commercially-available server operating systems. The web server 1625 can also run a variety of server applications, including HTTP servers, FTP servers, CGI servers, database servers, Java servers, and the like. In some instances, the web server 1625 may publish operations available operations as one or more web services.

The system 1600 may also include one or more file and or/application servers 1630, which can, in addition to an operating system, include one or more applications accessible by a client running on one or more of the user computers 1605, 1610, 1615. The server(s) 1630 may be one or more general purpose computers capable of executing programs or scripts in response to the user computers 1605, 1610 and 1615. As one example, the server may execute one or more web applications. The web application may be implemented as one or more scripts or programs written in any programming language, such as Java™, C, C# or C++, and/or any scripting language, such as Perl, Python, or TCL, as well as combinations of any programming/scripting languages. The application server(s) 1630 may also include database servers, including without limitation those commercially available from Oracle, Microsoft, Sybase™, IBM™ and the like, which can process requests from database clients running on a user computer 1605.

In some embodiments, an application server 1630 may create web pages dynamically for displaying the development system. The web pages created by the web application server 1630 may be forwarded to a user computer 1605 via a web server 1625. Similarly, the web server 1625 may be able to receive web page requests, web services invocations, and/or input data from a user computer 1605 and can forward the web page requests and/or input data to the web application server 1630.

In further embodiments, the server 1630 may function as a file server. Although for ease of description, FIG. 17 illustrates a separate web server 1625 and file/application server 1630, those skilled in the art will recognize that the functions described with respect to servers 1625, 1630 may be performed by a single server and/or a plurality of specialized servers, depending on implementation-specific needs and parameters.

The system 1600 may also include a database 1635. The database 1635 may reside in a variety of locations. By way of example, database 1635 may reside on a storage medium local to (and/or resident in) one or more of the computers 1605, 1610, 1615, 1625, 1630. Alternatively, it may be remote from any or all of the computers 1605, 1610, 1615, 1625, 1630, and in communication (e.g., via the network 1620) with one or more of these. In a particular set of embodiments, the database 1635 may reside in a storage-area network ("SAN") familiar to those skilled in the art. Similarly, any necessary files for performing the functions attributed to the computers 1605, 1610, 1615, 1625, 1630 may be stored locally on the respective computer and/or remotely, as appropriate. In one set of embodiments, the database 1635 may be a relational database, such as Oracle 10i®, that is adapted to store, update, and retrieve data in response to SQL-formatted commands.

Figure 17:
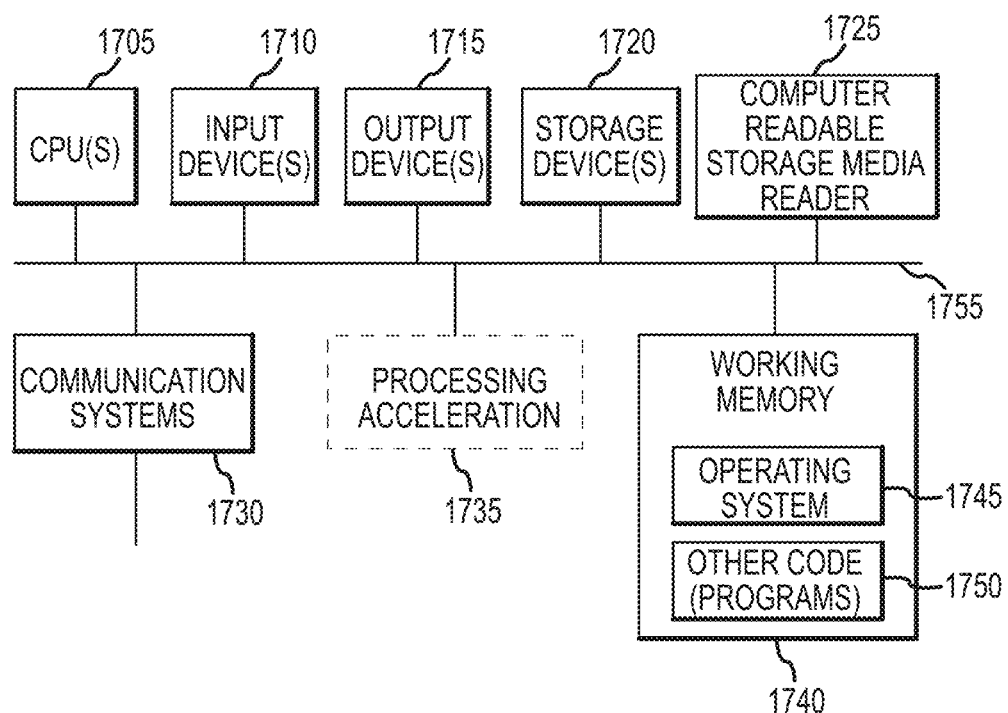
FIG. 17 is a schematic showing a computer network used by some embodiments of the present invention.

FIG. 17 illustrates one embodiment of a computer system 1700 upon which a web service connector or components of a web service connector may be deployed or executed. The computer system 1700 is shown comprising hardware elements that may be electrically coupled via a bus 1755. The hardware elements may include one or more central processing units (CPUs) 1705; one or more input devices 1710 (e.g., a mouse, a keyboard, etc.); and one or more output devices 1715 (e.g., a display device, a printer, etc.). The computer system 1700 may also include one or more storage device 1720. By way of example, storage device(s) 1720 may be disk drives, optical storage devices, solid-state storage device such as a random access memory ("RAM") and/or a read-only memory ("ROM"), which can be programmable, flash-updateable and/or the like.

The computer system 1700 may additionally include a computer-readable storage media reader 1725; a communications system 1730 (e.g., a modem, a network card (wireless or wired), an infra-red communication device, etc.); and working memory 1740, which may include RAM and ROM devices as described above. In some embodiments, the computer system 1700 may also include a processing acceleration unit 1735, which can include a DSP, a special-purpose processor and/or the like.

The computer-readable storage media reader 1725 can further be connected to a computer-readable storage medium, together (and, optionally, in combination with storage device(s) 1720) comprehensively representing remote, local, fixed, and/or removable storage devices plus storage media for temporarily and/or more permanently containing computer-readable information. The communications system 1730 may permit data to be exchanged with the network 1720 and/or any other computer described above with respect to the system 1700.

The computer system 1700 may also comprise software elements, shown as being currently located within a working memory 1740, including an operating system 1745 and/or other code 1750, such as program code implementing a web service connector or components of a web service connector. It should be appreciated that alternate embodiments of a computer system 1700 may have numerous variations from that described above. For example, customized hardware might also be used and/or particular elements might be implemented in hardware, software (including portable software, such as applets), or both. Further, connection to other computing devices such as network input/output devices may be employed.

In the foregoing description, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

While various embodiments of the present invention have been described in detail, it is apparent that modifications and alterations of those embodiments will occur to those skilled in the art. However, it is to be expressly understood that such modifications and alterations are within the scope and spirit of the present invention, as set forth in the following claims. In addition, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

What is claimed is:

1. A system for estimating water balance associated with a parcel, comprising:
an application server having software configured as a planner module and an optimizer module;
a software tool providing a client interface and configured to communicate with the application server;
a monitoring system configured to monitor water entering and exiting the parcel, wherein applied water, consumptive water use, and return water flow can be assessed or estimated, the monitoring system having a data collection device and a data communication device configured to communicate with the application server, wherein the data collection device includes:
first sensors that receive data associated with water delivered to the parcel,
second sensors that receive data associated with water leaving the parcel, and third sensors that receive data associated with evapotranspiration associated with the parcel;
wherein the planner module is configured to receive data from the client interface defining initial parcel configuration which is communicated to the optimizer module;
wherein the optimizer module of the application server using the input data and data from the first sensors, the second sensors, and the third sensors estimates consumptive water use associated with the parcel, the estimated consumptive water use comprising the amount of water delivered to the parcel minus the sum of water leaving the parcel and evapotranspiration associated with the parcel;
wherein the application server compares an allocated water budget to the estimated consumptive water use; and
wherein the planner module uses estimated consumptive water use to generate a farm utilization plan.

2. The system of claim 1, wherein the first sensors comprise at least one of rainfall sensors and water flow measurement devices having at least one of flumes, weirs, propeller meters, pressure transducers, shaft encoders, pipe or channel flow velocity sensors, and ultrasonic level sensors.

3. The system of claim 1, wherein the second sensors comprise at least one of return water flow sensors and water flow measurement devices having at least one of flumes, weirs, propeller meters, pressure transducers, shaft encoders, pipe or channel flow velocity sensors, and ultrasonic level sensors.

4. The system of claim 1, wherein the third sensors comprise at least one evapotranspiration measuring devices having at least one of remote thermal unit recorders, data loggers, and thermal and near infrared imagers, and weather monitoring equipment comprising at least one of temperature probes, relative humidity probes, precipitation gauges, anemometers, pyranometers, Bowen ratio equipment, eddy covariance equipment, scintillometers, near infrared and heat signature cameras, and evapotranspiration sensors.

5. The system of claim 1, wherein the application server generates a report associated with actual water used by the parcel and the estimated consumptive water use, which includes crop-water budget and water balance data.

6. The system of claim 1, wherein the third sensors receive data from aircraft mounted and satellite sensors.

7. The system of claim 1, wherein the client interface is a mobile device.

8. The system of claim 1, wherein the monitoring system is configured to gather information from at least one of a tracer test, an aquifer test, data from satellites and low altitude aerial gathering techniques, data from an aircraft, and data from a land-based vehicle.

9. The system of claim 1, wherein the monitoring system obtains data from at least one of aerial photography, aerial sensing means, local weather stations, ground level measurements, and satellite imagery.

10. The system of claim 1, wherein estimated consumptive water use is compared with historical water consumption associated with the parcel to allow a water right holder associated with the parcel to manage and optimize their agricultural operations and to trade, lease, or otherwise convey, all or a proportion of their water right.

11. The system of claim 1, wherein the data from the third sensors is combined with information related to crops being grown, water runoff, soil moisture, aerial and satellite data, and onsite data acquisition.

12. The system of claim 1, wherein the first sensor is associated with a stilling well positioned adjacent to a channel that delivers water to the parcel, the stilling well being in communication with a solar-powered remote terminal unit (RTU).

13. The system of claim 1, further comprising fourth sensors that receive data associated with subsurface soil moisture associated with the parcel; and wherein the application server using data from the first sensors, the second sensors, third sensors, and the fourth sensors estimates consumptive water use associated with the parcel, the estimated consumptive water use comprising the amount of water delivered to the parcel minus the sum of water leaving the parcel, subsurface soil moisture, and evapotranspiration associated with the parcel.

14. The system of claim 13, wherein the fourth sensors comprise at least one of soil measuring devices having at least one of a tensiometer, a gypsum block, a capacitance sensor, and a ground water sensor.

15. A system for estimating water balance associated with a parcel, comprising:
an application server having software configured as a planner module and an optimizer module;
a software tool providing a client interface and configured to communicate with the application server;
a monitoring system configured to monitor water entering and exiting the parcel, wherein applied water, consumptive water use, and return water flow can be assessed or estimated, the monitoring system having a data collection device and a data communication device configured to communicate with the application server, wherein the data collection device includes:
first sensors that receive data associated with water delivered to the parcel,
second sensors that receive data associated with water leaving the parcel,
third sensors that receive data associated with evapotranspiration associated with the parcel, and
fourth sensors that receive data associated with subsurface soil moisture associated with the parcel;
wherein the optimizer module of the application server using data from the first sensors, the second sensors, the third sensors, and fourth sensors estimates consumptive water use associated with the parcel, the estimated consumptive water use comprising the amount of water delivered to the parcel minus the sum of water leaving the parcel, subsurface soil moisture, and evapotranspiration associated with the parcel;

wherein the application server compares an allocated water budget to estimated consumptive water use; and wherein the planner module uses the estimated consumptive water use to generate a farm utilization plan.

16. The system of claim 15, wherein the fourth sensors comprise at least one of soil measuring devices having at least one of a tensiometer, a gypsum block, a capacitance sensor, and a ground water sensor.

17. A system for estimating water balance associated with a parcel, comprising:
an application server having a first processor with a software module;
a second processor having a software tool providing a client interface, the software tool configured to communicate with the software module of the application server;
a monitoring system configured to monitor water entering and exiting the parcel so applied water use, consumptive water use, and return flow can be assessed or estimated, the monitoring system having a data collection device and a data communication device, wherein the data collection device includes at least one of:
a device for measuring water delivered to the parcel,
a device for measuring subsurface soil moisture,
a device for measuring evapotranspiration,
weather monitoring equipment, and
return water flow sensors;
wherein the software module of the application server is also configured to estimate future consumptive water associated with the parcel using data from the monitoring system, the estimated consumptive water use comprising the amount of water delivered to the parcel minus the sum of water leaving the parcel, subsurface soil moisture, and evapotranspiration associated with the parcel.

18. The system of claim 17, wherein:
the device for measuring subsurface soil comprises at least one of a tensiometer, a gypsum block, and a capacitance sensor;
the device for measuring evapotranspiration comprises at least one of remote thermal unit recorders, data loggers, and thermal and near infrared imagers; and
the weather monitoring equipment comprises at least one of rainfall sensors, temperature probes, relative humidity probes, precipitation gauges, anemometers, pyranometers, Bowen ratio equipment, eddy covariance equipment, scintillometers, near infrared and heat signature cameras, and evapotranspiration sensors.

19. The system of claim 17, wherein the software module of the application server compares allocated water budget to estimated consumptive water use to generate a farm utilization plan comprising at least one of an annual water budget to be used on the parcel, an improved irrigation schedule, and a crop optimization routine to optimize future consumptive water use crop sensors.

20. The system of claim 17, wherein the second processor generates a report associated with the applied water use and estimated consumptive water use including crop-water budget and water balance data.

21. The system of claim 17, wherein estimated consumptive water use is compared with historical water consumption associated with the parcel to allow a water right holder associated with the parcel to manage and optimize their agricultural operations and to trade, lease, or otherwise convey, all or a proportion of their water right.

22. The system of claim 5, wherein information from the report is used in a request to sell or lease at least a portion of a water right in an open market.

23. The system of claim 22, wherein proceeds from the sale or lease offsets costs associated with implementing the farm utilization plan.

24. The system of claim 10, wherein the water right is traded, leased, or otherwise conveyed on an open market.

25. The system of claim 15, wherein the application server generates a report associated with actual water used by the parcel and the estimated consumptive water use, which includes crop-water budget and water balance data, wherein information from the report is used in a request to sell or lease at least a portion of a water right in an open market, and wherein proceeds from the sale or lease offsets costs associated with implementing the farm utilization plan.

26. The system of claim 15, wherein estimated consumptive water use is compared with historical water consumption associated with the parcel to allow a water right holder associated with the parcel to manage and optimize their agricultural operations and to trade, lease, or otherwise convey, all or a proportion of their water right, and wherein the water right is traded, leased, or otherwise conveyed on an open market.

27. The system of claim 19, wherein the second processor generates a report associated with the applied water use and estimated consumptive water use including crop-water budget and water balance data, and wherein proceeds from the sale or lease offsets costs associated with implementing the farm utilization plan.

28. The system of claim 21, wherein the water right is traded, leased, or otherwise conveyed on an open market.

29. The system of claim 28, wherein information from the report is used in a request to sell or lease at least a portion of a water right in an open market.

* * * * *